US012622274B2

(12) United States Patent
Hung et al.

(10) Patent No.:  US 12,622,274 B2
(45) Date of Patent:  May 5, 2026

(54) PACKAGES WITH LIQUID METAL AS HEAT-DISSIPATION MEDIA AND METHOD FORMING THE SAME

(71) Applicant: Taiwan Semiconductor Manufacturing Co., Ltd., Hsinchu (TW)

(72) Inventors: Wensen Hung, Zhubei City (TW); Tsung-Yu Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 490 days.

(21) Appl. No.: 18/150,853

(22) Filed: Jan. 6, 2023

(65) Prior Publication Data

US 2024/0038627 A1  Feb. 1, 2024

Related U.S. Application Data

(60) Provisional application No. 63/380,844, filed on Oct. 25, 2022, provisional application No. 63/369,675, filed on Jul. 28, 2022.

(51) Int. Cl.
*H01L 23/42* (2006.01)
*H01L 21/48* (2006.01)
(Continued)

(52) U.S. Cl.
CPC .......... *H01L 23/42* (2013.01); *H01L 21/4875* (2013.01); *H01L 21/565* (2013.01);
(Continued)

(58) Field of Classification Search
CPC ... H01L 21/4875; H01L 21/565; H01L 24/27; H01L 24/32; H01L 24/33; H01L 24/73; H01L 24/83; H01L 24/29; H01L 2224/26145; H01L 2224/2731; H01L 2224/29113; H01L 2224/29105; H01L 2224/32225; H01L 2224/32245; H01L 2224/33051; H01L 2224/83097; H01L 2224/83203
See application file for complete search history.

(56) References Cited

U.S. PATENT DOCUMENTS 5,459,352 A * 10/1995 Layton ................ H01L 23/3733
257/E23.09
5,561,590 A * 10/1996 Norell ................. H01L 23/3736
165/185

(Continued)

FOREIGN PATENT DOCUMENTS

TW          M623607 U        2/2022

*Primary Examiner* — Peniel M Gumedzoe
(74) *Attorney, Agent, or Firm* — Slater Matsil, LLP

(57) ABSTRACT

A method includes attaching a permeable plate to a metal lid, with the permeable plate including a metallic material, and dispensing a liquid-metal-comprising media to a first package component. The first package component is over and bonded to a second package component. The liquid-metal-comprising media includes a liquid metal therein. The method further includes attaching the metal lid to the second package component. During the attaching, the liquid-metal-comprising media migrates into the permeable plate to form a composite thermal interface material.

20 Claims, 30 Drawing Sheets

(51) Int. Cl.
    *H01L 21/56*     (2006.01)
    *H01L 23/00*     (2006.01)
    *H01L 23/31*     (2006.01)
    *H01L 23/498*     (2006.01)
    *H01L 25/16*     (2023.01)

(52) U.S. Cl.
    CPC .... *H01L 23/3107* (2013.01); *H01L 23/49816*
    (2013.01); *H01L 23/49827* (2013.01); *H01L*
    *24/27* (2013.01); *H01L 24/29* (2013.01);
    *H01L 24/32* (2013.01); *H01L 24/33* (2013.01);
    *H01L 24/73* (2013.01); *H01L 24/83* (2013.01);
    *H01L 25/16* (2013.01); *H01L 2224/26145*
    (2013.01); *H01L 2224/2731* (2013.01); *H01L*
    *2224/29105* (2013.01); *H01L 2224/29113*
    (2013.01); *H01L 2224/32225* (2013.01); *H01L*
    *2224/32245* (2013.01); *H01L 2224/33051*
    (2013.01); *H01L 2224/83097* (2013.01); *H01L*
    *2224/83203* (2013.01); *H01L 2924/1616*
    (2013.01); *H01L 2924/16235* (2013.01); *H01L*
    *2924/16251* (2013.01); *H01L 2924/165*
    (2013.01)

(56)           References Cited

U.S. PATENT DOCUMENTS

| | | | |
|---|---|---|---|
| 10,643,924 B1 | 5/2020 | Shen | |
| 2005/0155752 A1* | 7/2005 | Larson ................ | H01L 23/3736 |
| | | | 165/185 |
| 2020/0219786 A1* | 7/2020 | Hung .................. | H01L 21/4853 |

\* cited by examiner

66

54/60/62

200

| Forming a package | 202 |
|---|---|
| Attaching a permeable plate to a metal lid | 204 |
| Applying a liquid-metal-comprising media on a package component in the package | 206 |
| Bonding the metal lid to the package | 208 |

PACKAGES WITH LIQUID METAL AS HEAT-DISSIPATION MEDIA AND METHOD FORMING THE SAME

PRIORITY CLAIM AND CROSS-REFERENCE

This application claims the benefit of U.S. Patent Provisional Application No. 63/380,844, filed Oct. 25, 2022 and entitled "Packages with Liquid Metal as Heat-Dissipation Media and Method Forming the Same," and U.S. Patent Provisional Application No. 63/369,675, filed on Jul. 28, 2022, and entitled "3DIC Package for Ultra Low TR," which applications are hereby incorporated herein by reference.

BACKGROUND

In order to increase the functionality and integration level of integrated circuit packages, a plurality of package components such as device dies and package substrates may be bonded together. Due to the difference between different materials of the plurality of package components, warpage may occur. With the increase in the size of the packages, warpage become more severe.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
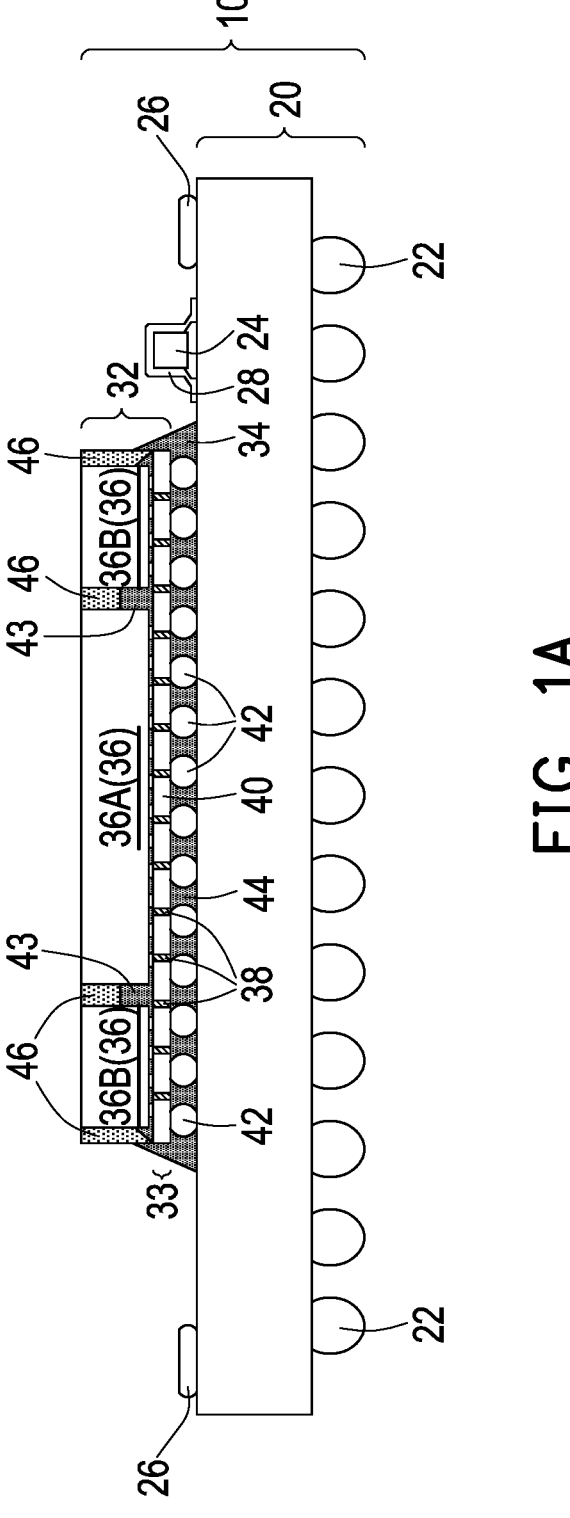
FIGS. 1A, 1B, and 2-5 illustrate the cross-sectional views and a top view of intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including a liquid metal as a heat-dissipation media and the method of forming the same are provided. In accordance with some embodiments of the present disclosure, a permeable plate is attached to a metal lid. A liquid-metal-comprising media is dispensed on a package component. In an assembly process, the liquid-metal-comprising media migrates through the permeable plate to contact the metal lid. The liquid-metal-comprising media has a low melting point, and has the ability of melting when the package is operated (powered up). Accordingly, the liquid-metal-comprising media has the ability of reshaping itself to fit the shape of the surfaces of the metal lid and the package component, and thus has improved contact to the surfaces of the metal lid and the package component. The heat dissipation from the package to the metal lid is thus improved. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1A, 1B, and 2-5 illustrate the cross-sectional views of intermediate stages in the formation of package including a liquid metal as a heat-dissipation media in accordance with some embodiments of the present disclosure. The corresponding processes are also reflected schematically in the process flow shown in FIG. 22.

Figure 22:
FIG. 22 illustrates a process flow for forming a package in accordance with some embodiments.
Figure 22:
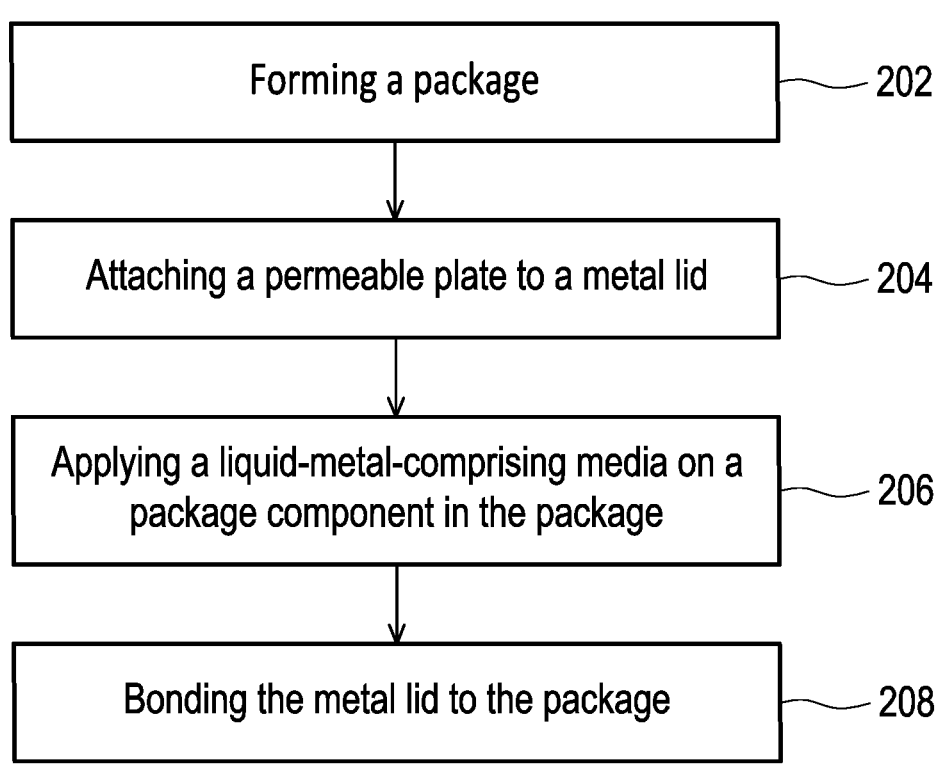

In accordance with some embodiments, as shown in FIG. 1A, package 10 is formed. The respective process is illustrated as process 202 in the process flow 200 as shown in FIG. 22. It is appreciated that the illustrated package 10 is an example, and other types of package components are also in the scope of the present application. For example, package 10 may or may not include a bridge die(s) therein, and may include one or more of levels of device dies therein. Furthermore, package 10 may be a fan-out package including a molding compound, and may or may not include through-vias penetrating through the molding compound.

In accordance with some embodiments, package 10 includes package component 20, and package components 24 and 32 over and bonded to package component 20. Package component 20 includes top conductive features on the top side and bottom conductive features 22 on the bottom side, and embedded electrical paths connecting the top conductive features to the bottom conductive features. In accordance with some embodiments, package component 20 is or comprises a package substrate, which may be a cored substrate including a core therein, or a core-less organic substrate. Alternatively, package component 20 may be or may comprise an interposer. Package component 20 may also be or comprises a device die or a package including a device die therein. Package component 24 may be or may comprise a device die. In accordance some embodiments, package component 24 is an Independent Passive Device (IPD) die, which may include a capacitor, an inductor, or a resistor therein.

Dielectric isolation layer 28 is formed on package component 24. Dielectric isolation layer 28 may comprise a polymer, a resin, an epoxy or the like, and may be formed through dispensing followed by curing. Dielectric isolation layer 28 may also be formed of perylene. Dielectric isolation layer 28 is used to electrically insulate the electrical features (such as bond pads) of package component 24, so that if the subsequently used liquid metal, if flowing out of the intended location, will not electrically short package component 24 to other electrically conductive features. Adhesive 26 is also dispensed on the top surface of package component 20.

Package component 32 is bonded to package component 20. Package component 32 may include device dies therein, and may or may not include other package components such as interposers, packages, die stacks, or the like. In accordance with some embodiments, package component 32 includes package components 33, 36A, and 36B. In accordance with some embodiments, package component 33 is or comprises an interposer, which includes a substrate 40 and the corresponding dielectric layers and redistribution lines (not shown) formed on the top side and the bottom side of substrate 40. Accordingly, package component 33 may also be referred to as interposer 33, while package component 33 may also be of other types. Through-substrate vias 38 (sometimes referred to as through-silicon vias when substrate 40 is a silicon substrate) penetrate through substrate 40. Through-substrate vias 38 are used to electrically connect the conductive features on the top side and the bottom side of substrate 40 to each other. Solder regions 42 may be underlying and joined to interposers, and are used to bond package component 33 to package component 20. Other bonding schemes such as metal-to-metal direct bonding, composite bonding including both of dielectric-to-dielectric bonding and metal-to-metal bonding, or the like, may also be used for bonding package component 33 to package component 20.

In accordance with some embodiments, package components 36A and 36B are bonded to the respective underlying package component 33. FIG. 1A illustrates a cross-section in which one package component 36A and two package components 36B are visible, and are bonded to the same package component 33 as an example. Package components 36A and 36B may be different types of package components, and are collectively referred to as package components 36.

Each of package components 36 may be a device die, a package with a device die(s) packaged therein, a system-on-Chip die including a plurality of integrated circuits (or device dies) integrated as a system, or the like. The device dies in package components 36 may be or may comprise logic dies, memory dies, input-output dies, Integrated Passive Devices (IPDs), or the like, or combinations thereof. For example, the logic device dies in package components 36 may be Central Processing Unit (CPU) dies, Graphic Processing Unit (GPU) dies, mobile application dies, Micro Control Unit (MCU) dies, BaseBand (BB) dies, Application processor (AP) dies, or the like. The memory dies in package components 36 may include Static Random-Access Memory (SRAM) dies, Dynamic Random-Access Memory (DRAM) dies, or the like. The device dies in package components 36 may include semiconductor substrates and interconnect structures.

In the subsequent discussion in accordance with some example embodiments, package components 36A are referred to as device dies, which may be system-on-chip dies in accordance with some embodiments. Package components 36B may be memory stacks such as High-Performance Memory (HBM) stacks. Package components 36B may include memory dies forming a die stack, and an encapsulant (such as a molding compound) encapsulating the memory dies therein. Package components 36 may be bonded to the underlying package component 33, for example, through solder regions.

Underfill 43 is dispensed between package components 36 and the underlying package component 33. In accordance with some embodiments, package component 32 is formed through a chip-on-wafer bonding process, wherein package components 36, which are discrete chips/packages, are bonded to the package components 33 that are in an unsawed wafer to form a reconstructed wafer. After the dispensing of underfill 43, an encapsulant such as molding compound 46 may be applied, followed by a planarization process on the molding compound 46 to level its top surface with the top surfaces of package components 36. A reconstructed wafer is thus formed. The reconstructed wafer is sawed apart to form discrete package components 32, which are placed on package component 20.

After the placement of package components 32 on package component 20, solder regions 42 are reflowed to bond package components 32 to package component 20. Underfill 34 may be dispensed into the gap 22 between package components 32 and package component 20.

Figure 1B:
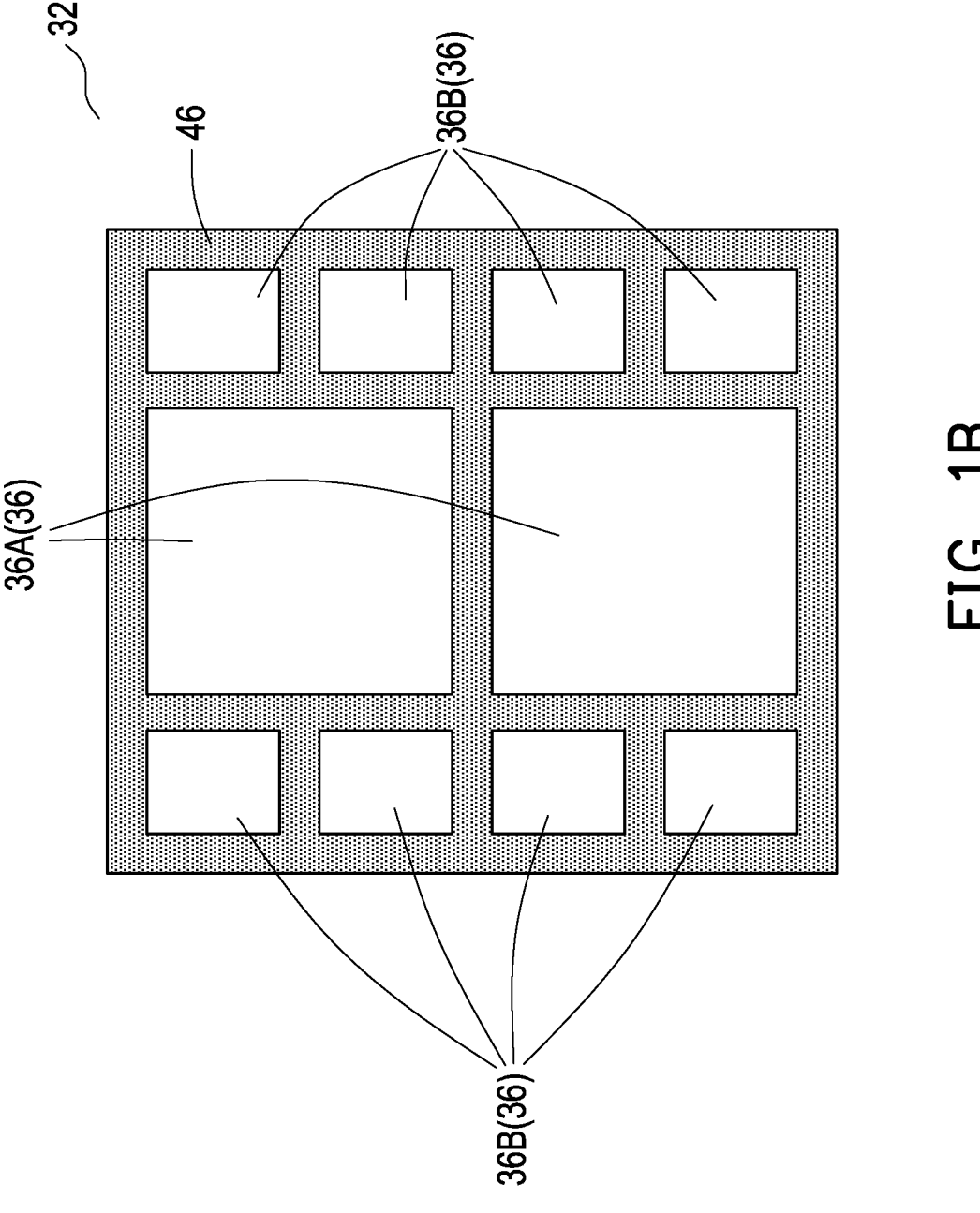

FIG. 1B illustrates an example top view of the package component 32 as shown in FIG. 1A. Package component 32 may include one or more device die(s) 36A, which may be system-on-chip dies, and a plurality of package components 36B. Encapsulant (for example, a molding compound) 46 fills the spaces between neighboring package components 36. The substrates such as silicon substrates of package components 36 may be exposed through encapsulant 46.

Figure 2:
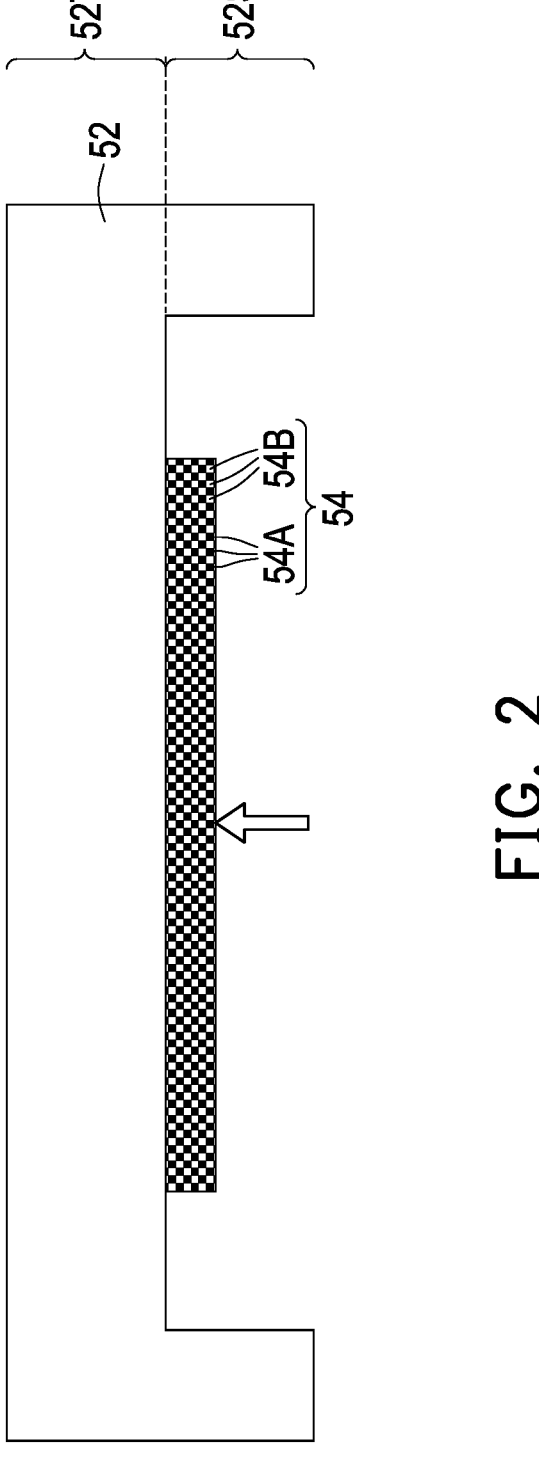

FIG. 2 illustrates the attachment of permeable plate 54 to metal lid 52 in accordance with some embodiments. The respective process is illustrated as process 204 in the process flow 200 as shown in FIG. 22. Metal lid 52 may be formed of or comprise copper, aluminum, stainless steel, or the like, and is used for the protection and also the heat dissipation of package component 32 (FIG. 1A). Metal lid 52 may include a top portion 52T, and skirt portion 52S underlying and joined to top portion 52T. Permeable plate 54, depending on its material, may be attached to metal lid 52 through solder bonding, powder filling & sintering on the surface of metal lid 52, brazing bonding onto the surface of metal lid 52, or the like.

Permeable plate 54 is formed of or comprises a structure that allows liquid metal to penetrate through, so that the liquid metal may migrate from the bottom to the top of permeable plate 54 through the internal channels inside permeable plate 54. For example, permeable plate 54 may comprise thermal-conductive material, and through-channels (which may be through-holes, trenches, interconnected pores, or the like) that extend from the bottom surface to the top surface of permeable plate 54. The migration of the liquid metal may be achieved through capillary in accordance with some embodiments. In accordance with some embodiments, permeable plate 54 has a thickness in the range between about 50 μm and about 300 μm.

FIGS. 6A, 6B, 6C, 6D, 6E, 6F, and 6G illustrate some example permeable plates 54. Permeable plate 54 may have compressibility in the subsequent assembly process, which means that permeable plate 54 may be flexible, and its shape may change in the assembly process to fit the shapes of the surfaces of package component 32 and metal lid 52.

Figure 6A:
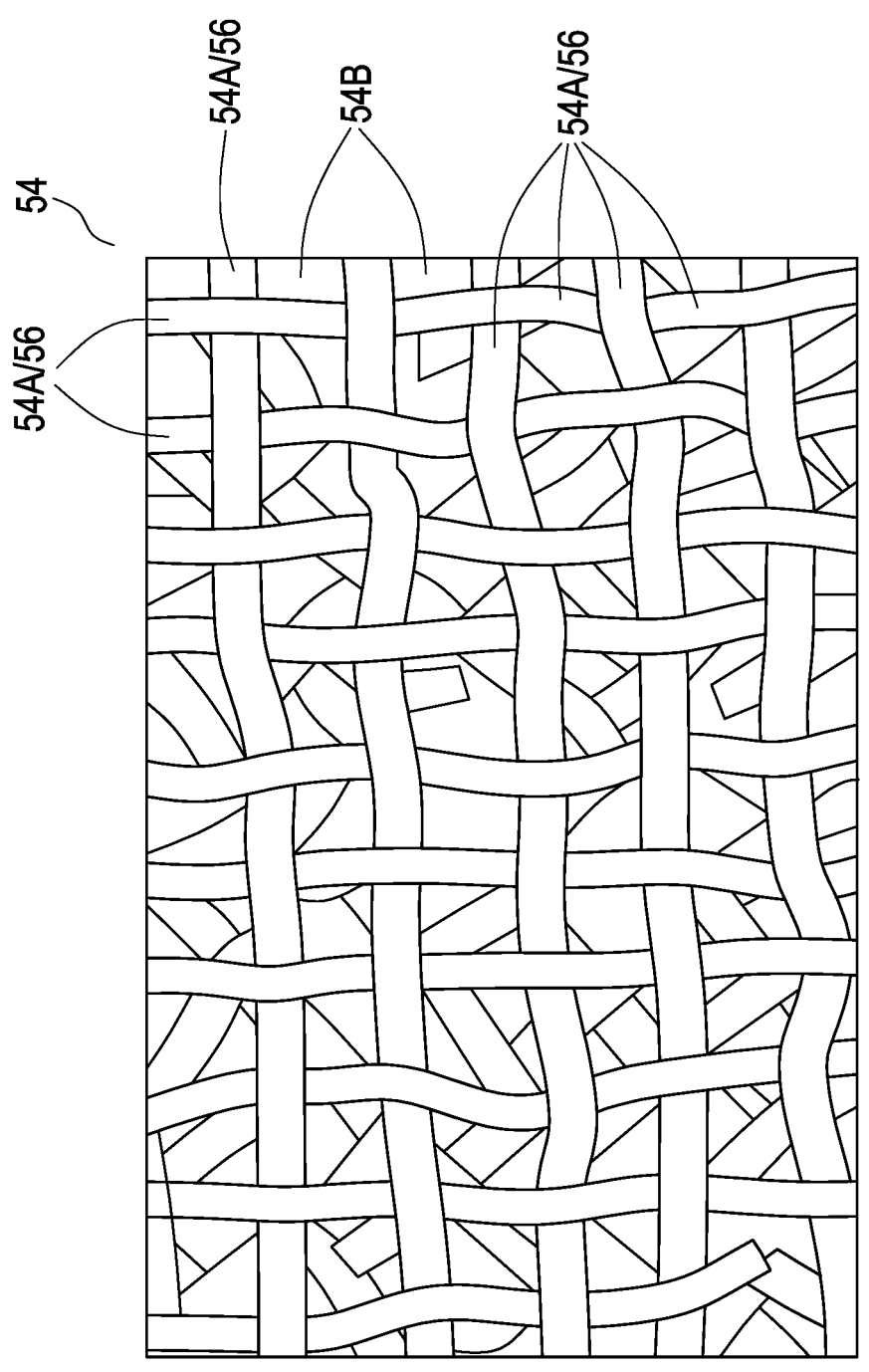
FIGS. 6A, 6B, 6C, 6D, 6E, 6F, and 6G illustrate the plane views and cross-sectional views of some permeable plates in accordance with some embodiments.
Figure 6B:
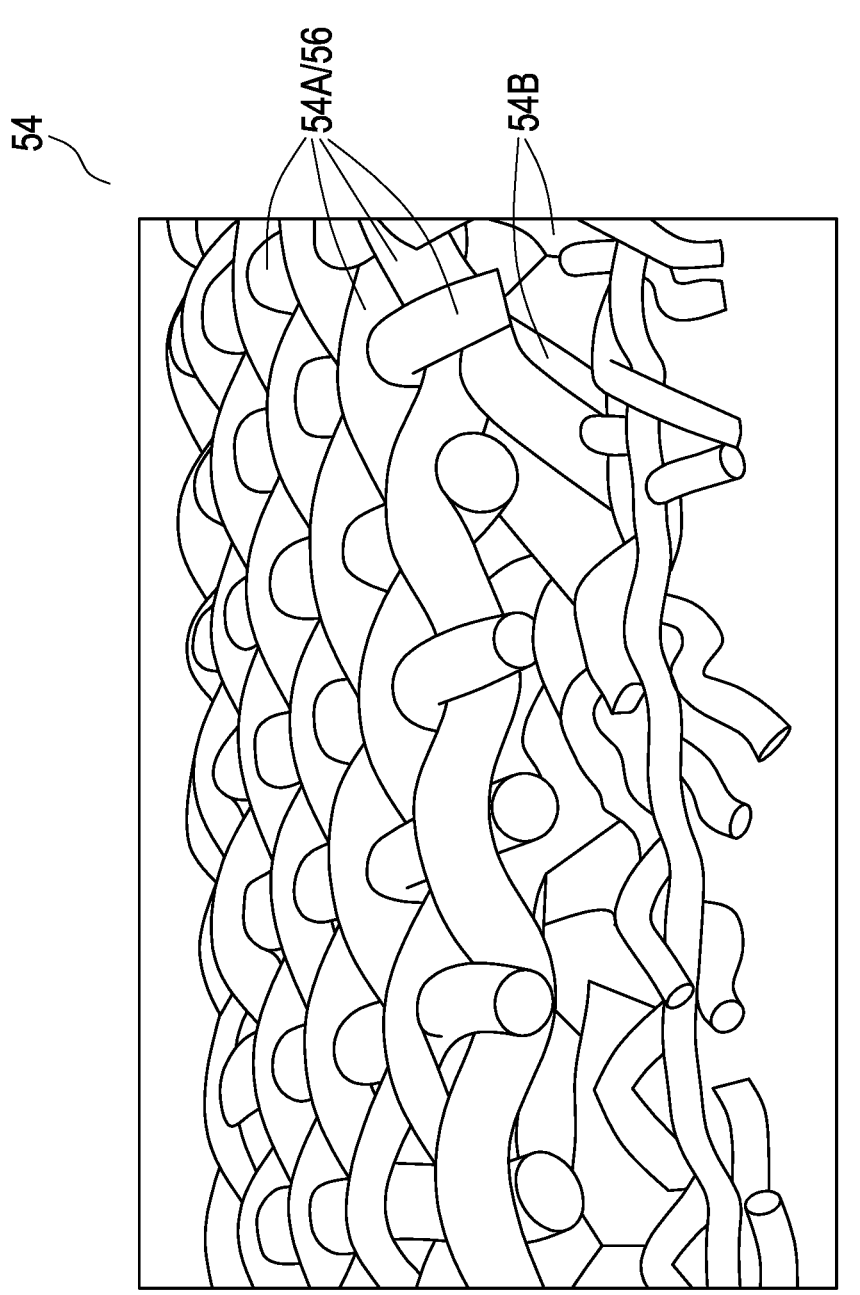

Referring to FIGS. 6A and 6B, which illustrate a top view and a perspective view, respectively, permeable plate 54 comprises a metal mesh comprising metal wires 56 (which are also referred to as thermal conductive material 54A) woven together into the metal mesh. In an example embodiment, metal wires 56 include horizontal metal wires and vertical metal wires. There may be a plurality of layers of metal meshes comprised in permeable plate 54. Some metal wires in one metal mesh layer may be parallel to some other metal wires in its neighboring metal mesh layers. Alternatively, the metal wires in one metal mesh may be neither parallel to nor perpendicular to the metal wires in its neighboring metal meshes. For example, the metal wires in neighboring metal mesh layers may form 45-degree angles with each other. The gaps between metal wires form through-channels 54B.

Figure 6C:
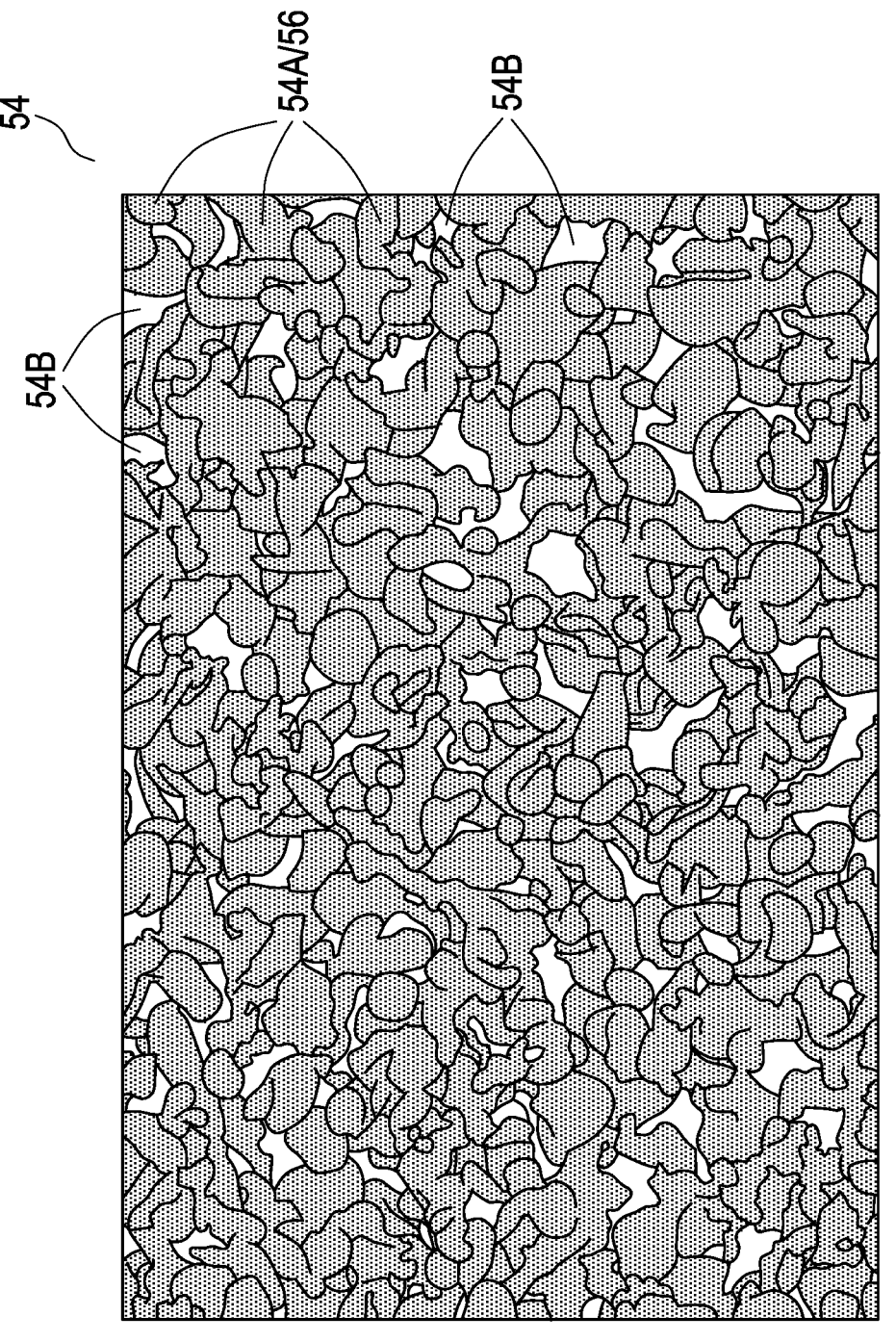

FIG. 6C illustrates the perspective view of a portion of a sintered-type permeable plate 54 in accordance with alternative embodiments. The sintered-type permeable plate 54 may be manufactured by dispensing metal particles/powder on the surface of metal lid 54, followed by a sintering process. As a result, as shown in FIG. 6C, permeable plate 54 has a rough surface, with the particles joined together to form a plurality of pores (micro cavities) between the joined particles. The pores are interconnected and may penetrate through permeable plate 54 to form through-channels 54B.

Figure 6D:
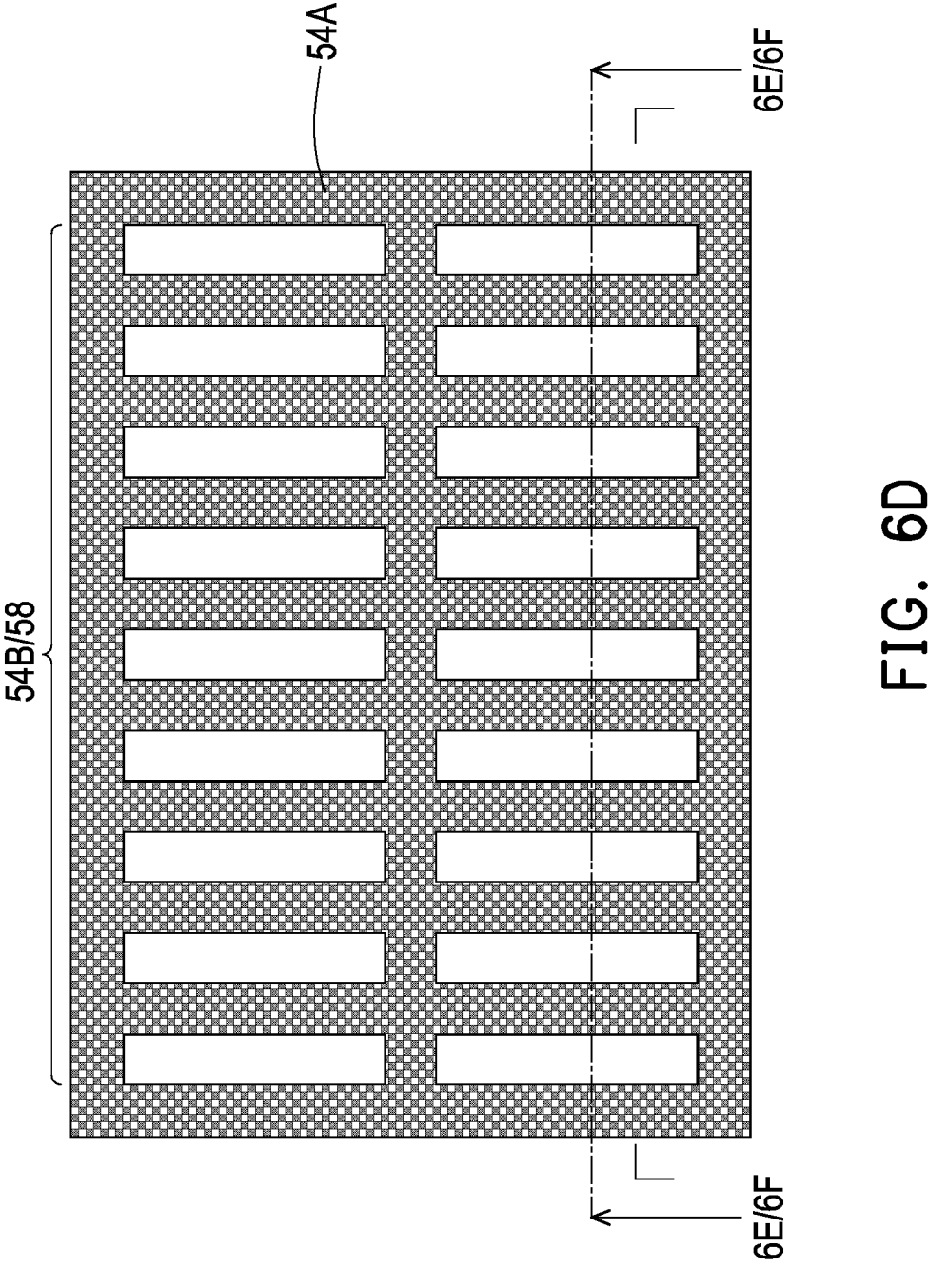
Figures 6E, 6F, 6G:
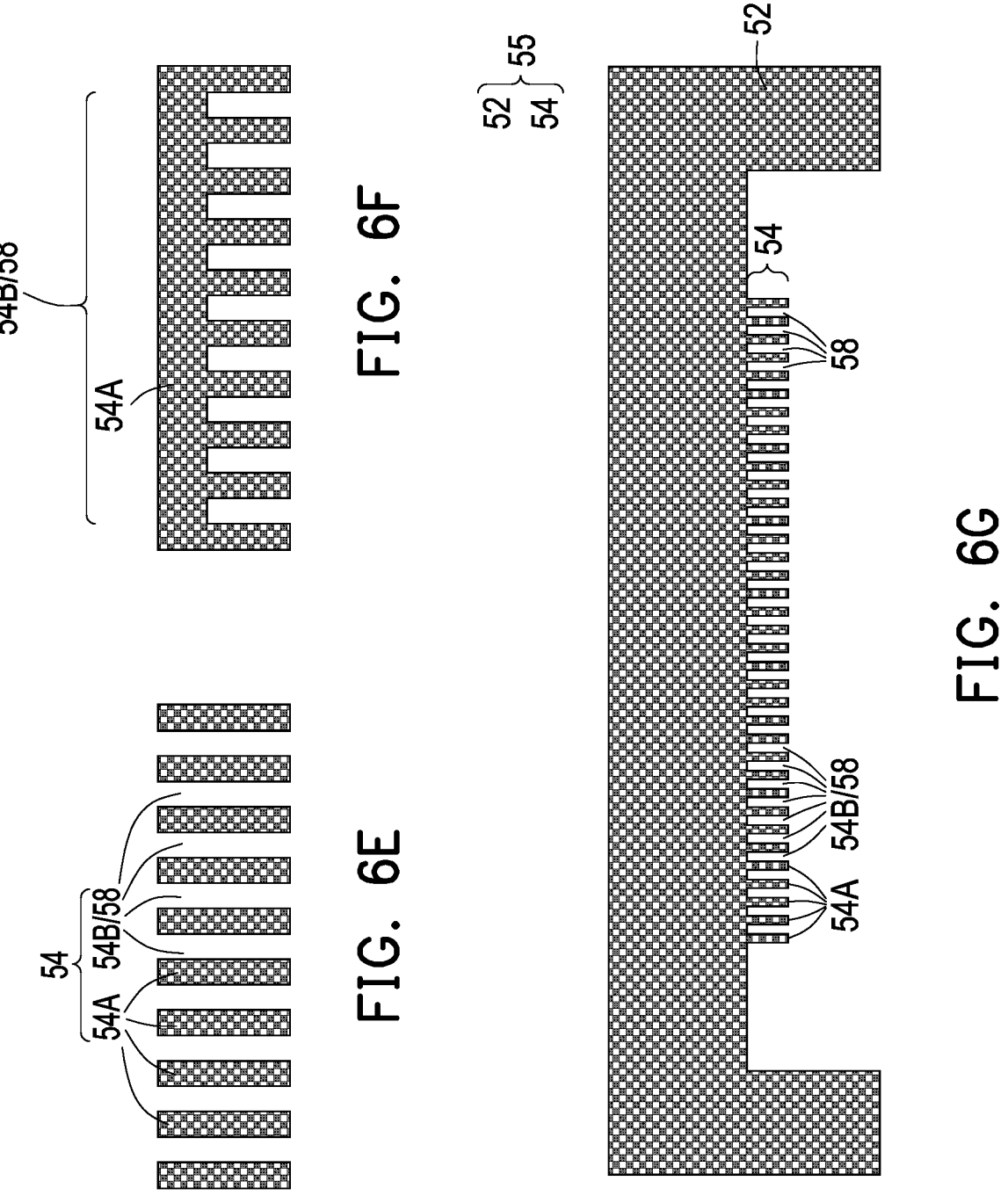

FIG. 6D illustrates a plane view of a portion of permeable plate 54 in accordance with alternative embodiments. The permeable plate 54 includes a metal plate with trenches 58 (which are also through-channels 54B) formed therein. In accordance with some embodiments, trenches 58 penetrate through permeable plate 54, as shown in FIG. 6E, which shows the cross-section 6E-6E in FIG. 6D. In accordance with alternative embodiments, trenches 58 extend into, but do not penetrate through, permeable plate 54, as shown in FIG. 6F, which shows the cross-section 6F-6F in FIG. 6D. The embodiments as shown in FIG. 6F may be applied when metal lid 52 and permeable plate 54 form a unibody thermal conductive feature 55 as shown in FIG. 6G. The trenches 58 in FIGS. 6D, 6E, 6F, and 6G may be formed, for example, through an etching process.

FIG. 6G illustrates the formation of metal lid 52 and permeable plate 54, which are formed as a unibody thermal conductive feature 55 in accordance with some embodiments. Accordingly, metal lid 52 and permeable plate 54 are formed of a same material, with not distinguishable interface formed in between. Unibody thermal conductive feature 55 may be formed by pre-forming metal lid 52, and then etching a portion of the unibody thermal conductive feature 55 to form trenches 58. In accordance with alternative embodiments, the unibody thermal conductive feature 55 is formed through 3D printing, with metal lid 52 and permeable plate 54 being printed in the same printing process.

Figures 21A, 21B, 21C:
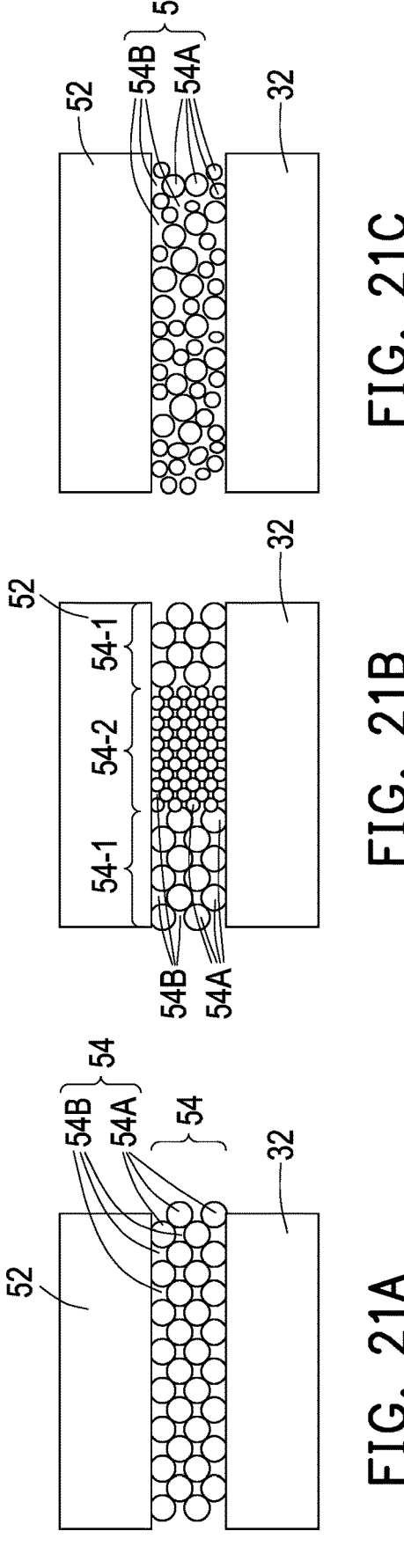
FIGS. 21A, 21B, and 21C illustrate the cross-sectional views of permeable plates with uniform or non-uniform densities in accordance with some embodiments.

FIGS. 21A, 21B, and 21C schematically illustrate the densities of metals and the porosities in permeable plate 54 in accordance with some embodiments. The porosity in permeable plate 54 may be in the range between about 30 percent and about 98 percent, and may be in the range between about 40 percent and about 70 percent.

In FIG. 21A, different portions of the permeable plate 54 have a uniform metal density and a uniform porosity value. In FIG. 21B, different portions of the permeable plate 54 have non-uniform metal density values and non-uniform porosity values. In FIG. 21C, the density and the porosity in different portions of permeable plate 54 have random values.

Figure 3:
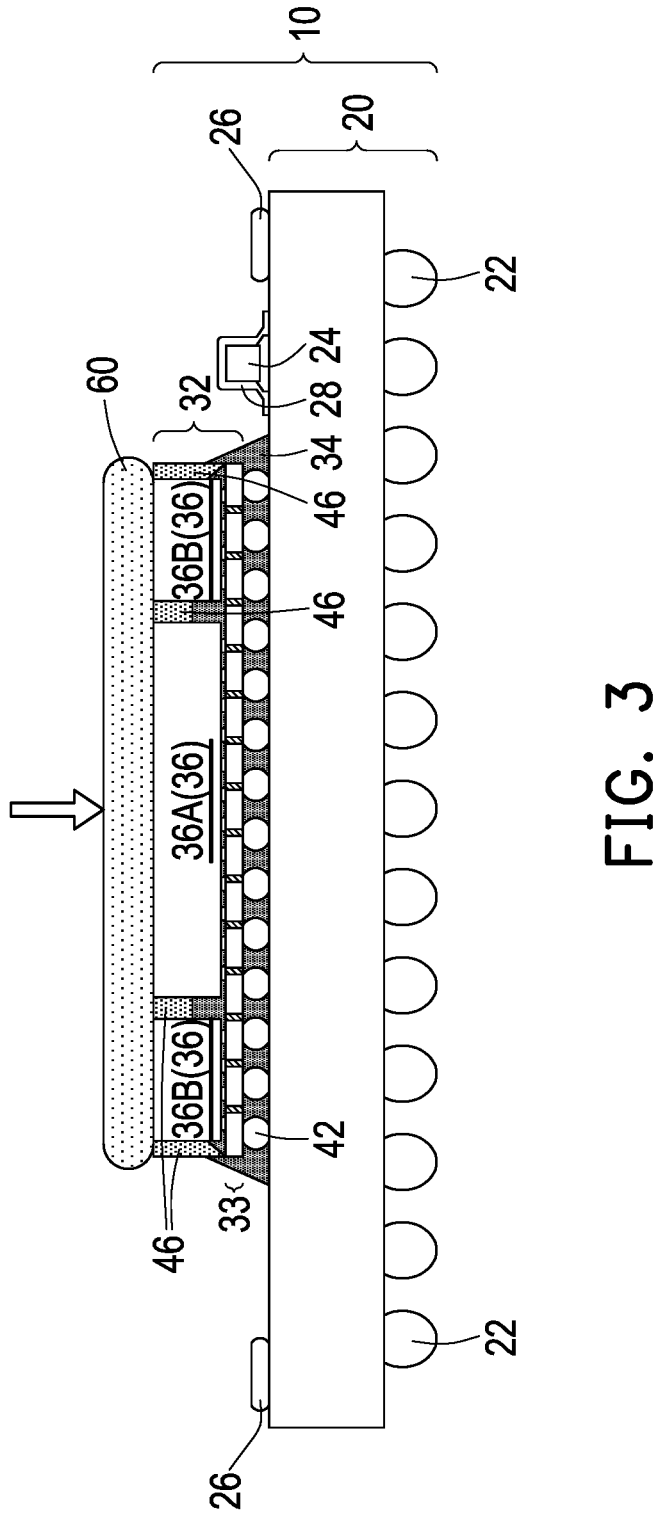
Figure 4:
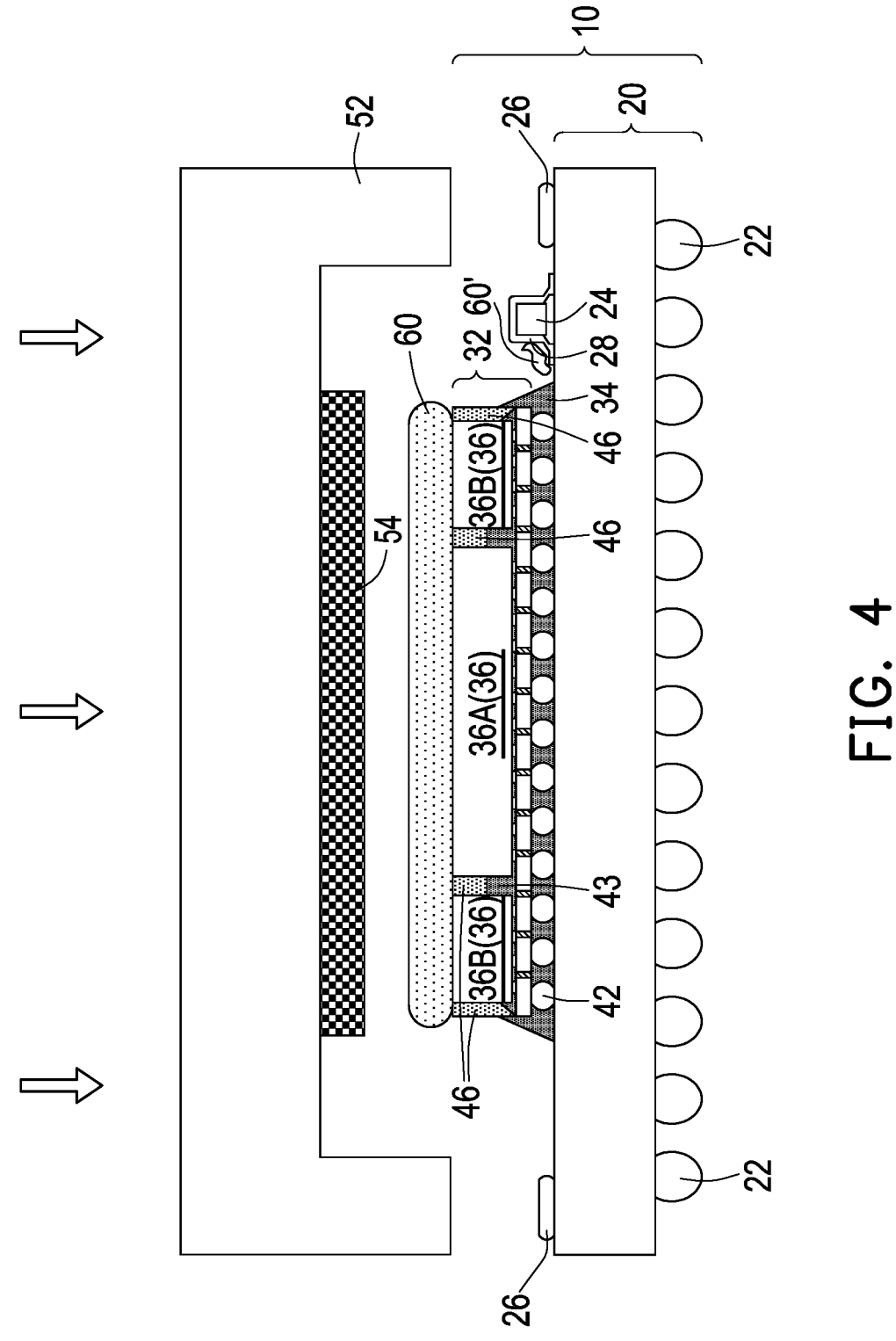
Figure 5:
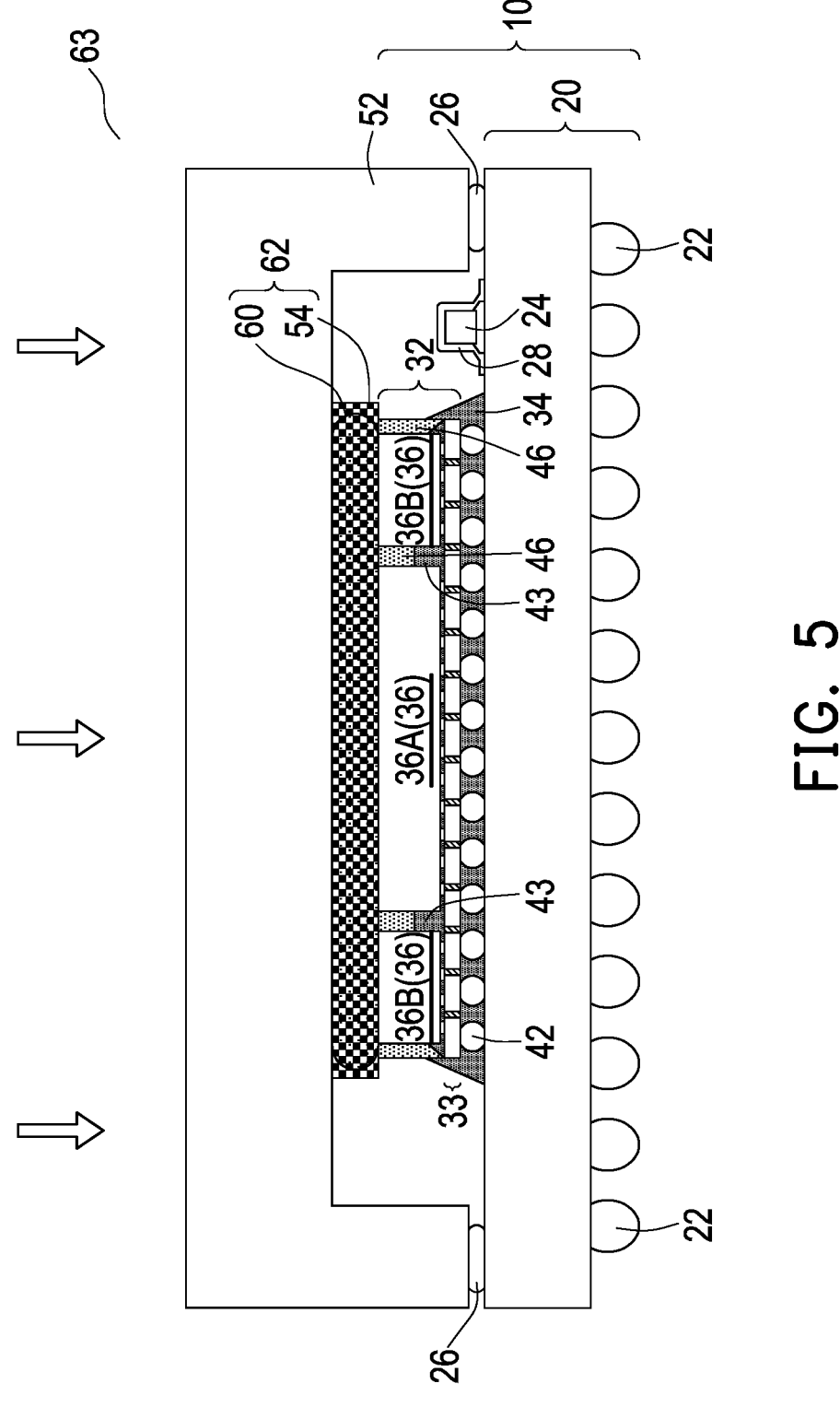

Referring to FIG. 3, liquid-metal-comprising media 60 is applied on the top surface of package component 32. The respective process is illustrated as process 206 in the process flow 200 as shown in FIG. 22. Liquid-metal-comprising media 60 comprises a liquid metal therein. Through-out the description, the term "liquid metal" refers to a metal or a metal alloy that may experience phase change to convert to a flowable form at a temperature higher than a threshold temperature. The threshold temperature is lower than the assembly temperature in the assembly process as shown in FIGS. 4 and 5. The threshold temperature may also be lower than package-operation temperatures, which are the temperatures that the top surface of package components 36 may reach when package components 36 are operated (powered up). In accordance with some embodiments, the threshold temperature may be lower than about 200° C., lower than about 150° C., lower than about 105° C., or lower than about 85° C. For example, the threshold temperature may be around 60° C. in accordance with some embodiments.

In accordance with some embodiments, liquid-metal-comprising media 60 is applied on the top surface of package component 32 at room temperature, which may be in the range between about 18° C. and about 30° C. At the time of applying, liquid-metal-comprising media 60 may be a solid pad or a paste. The solid pad may include a homogenous liquid metal material, or may include a liquid metal (which is also a solid when liquid-metal-comprising media 60 is applied) and metal particles mixed in the liquid metal that is in the solid form. The metal particles remain as being solid in subsequent assembly process, and during the operation of the package.

Liquid-metal-comprising media 60, when being a paste, may include a liquid metal, which is a liquid when liquid-metal-comprising media 60 is applied on package component 32. In accordance with some embodiments, liquid-metal-comprising media 60 includes metal particles mixed in the liquid metal. The metal particles remain as being solid in subsequent assembly process, and during the operation of the package. In accordance with alternative embodiments, liquid-metal-comprising media 60 is a homogeneous material that is liquid. The liquid metal may have a higher viscosity at room temperature so that its flowability is low and is easy to apply, and the viscosity is lower when temperature rises, for example, in the assembly process and the operation of the package.

At the temperature lower than or equal to the threshold temperature, the liquid-metal-comprising media 60 may be a solid, a liquid, or may be a paste including a liquid and solid particles in the liquid. At the temperature higher than the threshold temperature, the liquid-metal-comprising media 60 may be fully liquid, or may be a paste including solid particles in the liquid metal that has become a liquid.

In accordance with some embodiments, the liquid metal in liquid-metal-comprising media 60 may have a phase-change temperature in the range between about 60° C. and about 85° C. The temperature of 85° C. may be the lower temperature limit that package components 36 (when being a system-on-chip dies) may achieve. Accordingly, selecting liquid-metal-comprising media 60 as having phase-change temperature lower than 85° C. may ensure that during the operation of the device die, the liquid metal may be in the liquid form, and may provide good thermal conductivity. On the other hand, the phase-change temperature cannot be too low. Otherwise, the flowability of liquid-metal-comprising media 60 is too high, and it is difficult to apply liquid-metal-comprising media 60 and withhold it inside permeable plate 54.

When liquid-metal-comprising media 60 has a proper phase-change temperature, in the assembly process as shown in FIGS. 4 and 5 or during the operation of the package, the liquid metal may be softened, and with the increase in the temperature and/or the prolonged exposure to the increased temperature, the viscosity of the liquid metal is reduced, and the liquid metal may eventually become a liquid.

In accordance with some embodiments, the liquid metal may be a bismuth-based alloy, a gallium-based alloy, the mixtures thereof, and/or alloys thereof. The bismuth-based alloy may include an alloy of indium, tin and bismuth, an alloy of indium, tin, bismuth and silver, an alloy of bismuth, silver and tin, or the like. The gallium-based alloy may include a combination of gallium, tin and bismuth, a combination of gallium, gold, platinum and palladium, a combination of gallium, gold, platinum and copper, etc.

In accordance with some embodiments, the solid metal particles that are mixed with the liquid may include the particles of tin, gold, platinum, palladium, silver, rhodium, copper, nickel, cobalt, iron or the like, or combinations thereof.

In accordance with some embodiments, permeable plate 54 has a thermal conductivity in the range between about 30 W/m*K and about 400 W/m*K. Liquid-metal-comprising media 60 may have a thermal conductivity in the range between about 5 W/m*K and about 200 W/m*K. In accordance with some embodiments, depending on the materials, the thermal conductivity of permeable plate 54 may be higher than or equal to (and may also be lower than) the thermal conductivity of liquid-metal-comprising media 60.

Referring again to FIG. 3, when liquid-metal-comprising media 60 is a solid pad, it is placed on the top of package component 32. When liquid-metal-comprising media 60 is a paste, it is dispensed on the top of package component 32 through a dispenser. In accordance with some embodiments, as illustrated, permeable plate 54 is attached to metal lid 52, and liquid-metal-comprising media 60 is applied on package component 32, respectively. In accordance with alternative embodiments, liquid-metal-comprising media 60 may be applied on metal lid 52, while permeable plate 54 may be attached to package component 32.

Referring to FIG. 4, metal lid 52 and permeable plate 54 are picked up, and permeable plate 54 is aligned to liquid-metal-comprising media 60. Metal lid 52 and permeable plate 54 may be heated by the wafer head used for picking up metal lid 52. Package 10 may also be heated, so that the temperature of liquid-metal-comprising media 60 is increased.

In a subsequent process, as shown in FIG. 5, metal lid 52 is assembled with (and hence is bonded to) package component 20 through adhesive 26. The respective process is illustrated as process 208 in the process flow 200 as shown in FIG. 22. Package 63 is thus formed. In accordance with some embodiments, the assembly process includes both of a pressing process and a heating process. For example, metal lid 52 may be pressed down with a pressure in the range between about 20 psi and about 100 psi. The temperature of the metal pad lid, liquid-metal-comprising media 60, and permeable plate 54 may be in the range between about 60° C. and about 160° C., and may be in the range between about 140° C. and about 160° C.

In the assembly process, the liquid metal in liquid-metal-comprising media 60, which liquid metal may have a phase-change temperature in the range between about 60° C. and about 85° C., experiences phase change, and will be converted into a flowable form. For example, if the liquid-metal-comprising media 60 was a solid plate at the time it was placed on package component 32, the liquid metal, which was also a solid, also becomes a liquid during the assembly process. If the liquid-metal-comprising media 60 was a paste, its viscosity will reduce during the assembly process, and its flowability improves. If liquid-metal-comprising media 60 was a full liquid when it was placed on package component 32, liquid-metal-comprising media 60 remains as being a full liquid during and after the assembly process.

As shown in FIG. 4, there is a possibility that the liquid metal may flow out of permeable plate 54, and the out-flowing portion is referred to as 60′. The out-flowing liquid metal has the possibility of electrically shorting some of features such as the metal pads and the solder regions of IPD 24. Accordingly, dielectric isolation layer 28 is used to electrically insulate the out-flowing portion of the liquid metal from IPD 24.

With the permeable plate 54 having through-channels therein, due to capillary, liquid-metal-comprising media 60 migrates into the through-channels in permeable plate 54, and eventually penetrates through permeable plate 54 to be in physical contact with the bottom surface of metal lid 52. If liquid-metal-comprising media 60 comprises solid particles that are not molten during the assembly process, the solid particles also moves in the through-channels along with the liquid metal that is in the liquid form. It is appreciated that due to the non-uniformity, some parts of the through-channels in permeable plate 54 may be filled with liquid-metal-comprising media 60. During the attachment of metal lid 52 onto liquid-metal-comprising media 60, the elevated temperature (such as around 140° C. to about 160° C.) may cause the warpage of these features to change, which allows the liquid metal to uniformly fill the remaining air gaps of the through-channels in permeable plate 54. It is also possible that some parts of the through-channels in permeable plate 54 may remain as being air gaps after the assembly process.

Permeable plate 54 and the liquid-metal-comprising media 60 collectively act as a Thermal Interface Material (TIM), and hence are collectively referred to as composite TIM 62 hereinafter. An advantageous feature of the embodiments of the present disclosure is that the liquid metal may flow, and hence may have its shape changed according to the surface-change of package component 32 and metal lid 52. For example, package component 32 may have warpage, and the warpage may change at different stages and different temperatures in the assembly process and the operation of the package. If a solid TIM is used, there will be voids generated between package component 32, the solid TIM, and metal lid 52, especially when package component 32 is very hot during the operation. This causes the warpage to be more severe and voids to be enlarged, hence the heat dissipation is degraded. By using the liquid metal, the liquid metal has better flowability when the temperature rises, and hence can change its shape to fit the warpage. The heat dissipation of the composite TIM 62 is thus improved compared to if hard TIMs are used.

Figure 7:
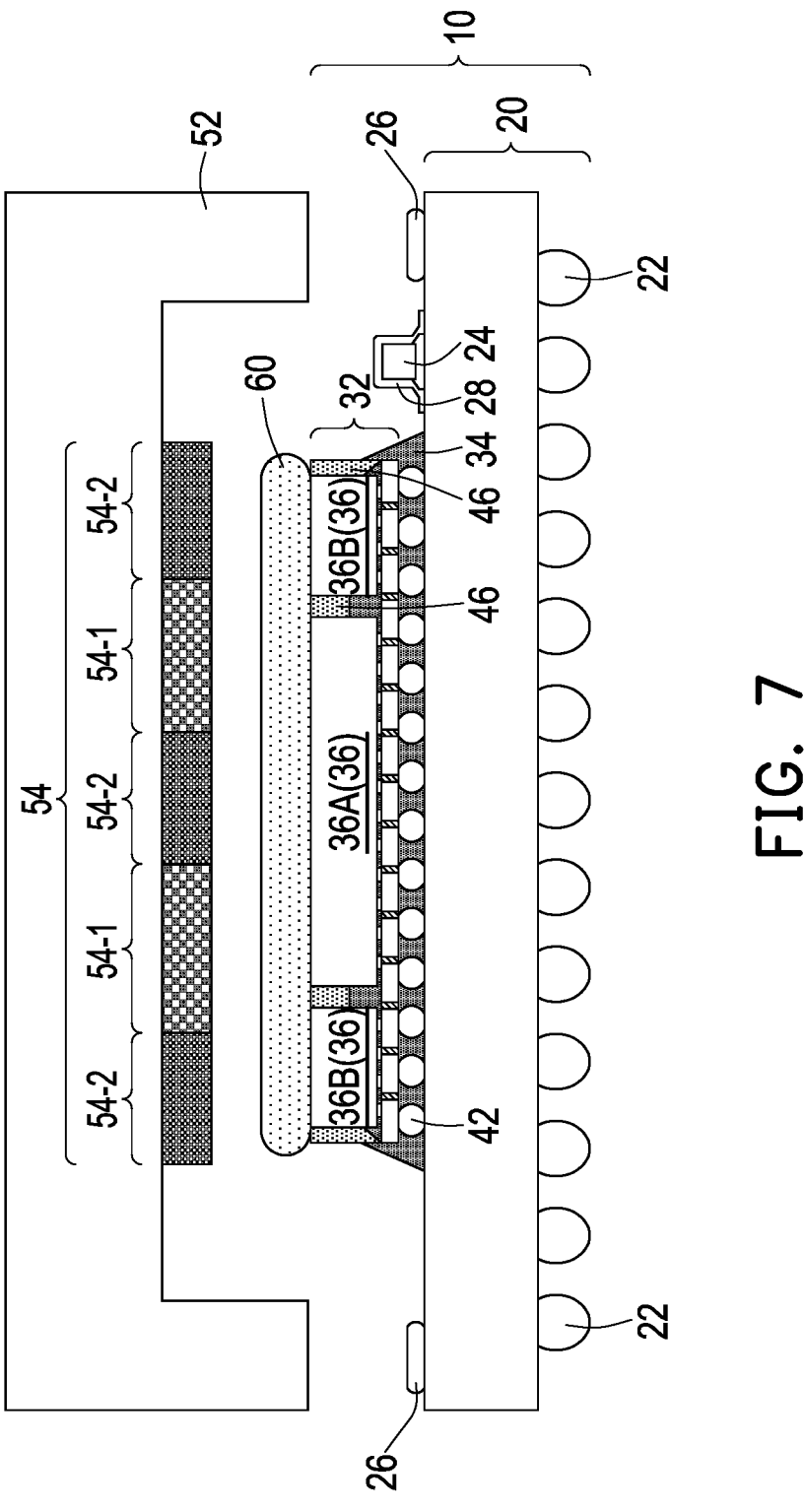
FIGS. 7-9 illustrate the cross-sectional views and a top view of intermediate stages in the formation of a package including a permeable plate with different portions having different densities in accordance with some embodiments.
Figure 8:
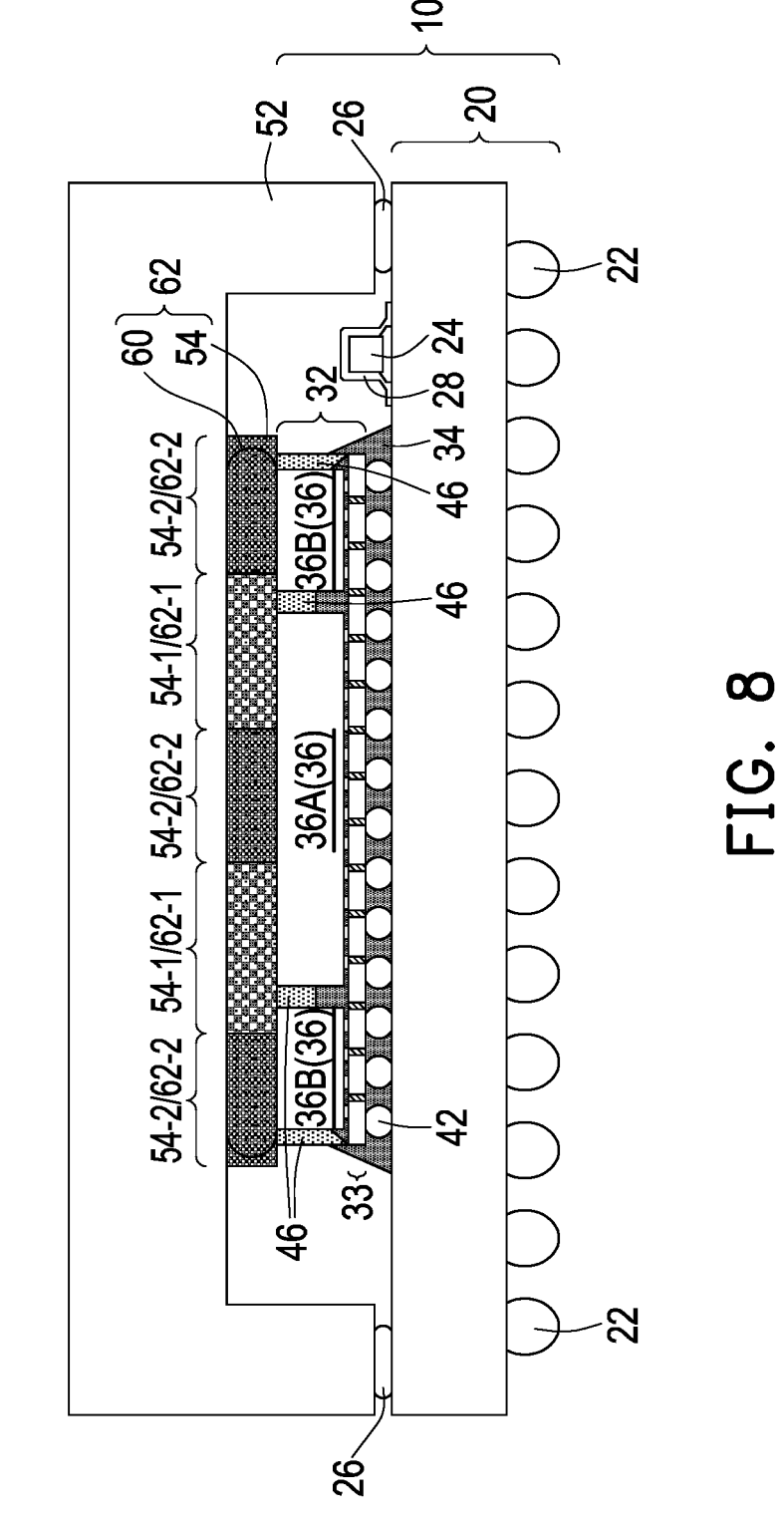

FIGS. 7 and 8 illustrate the cross-sectional views of intermediate stages in the formation of a package in accordance with alternative embodiments of the present disclosure. Unless specified otherwise, the materials, the structures, and the formation processes of the components in these embodiments are essentially the same as the like components denoted by like reference numerals in the preceding embodiments. The details regarding the materials, the structures, and the formation processes of the components shown in FIGS. 7 and 8 (and in subsequent figures) may thus be found in the discussion of the preceding embodiments whenever applicable.

Figure 9:
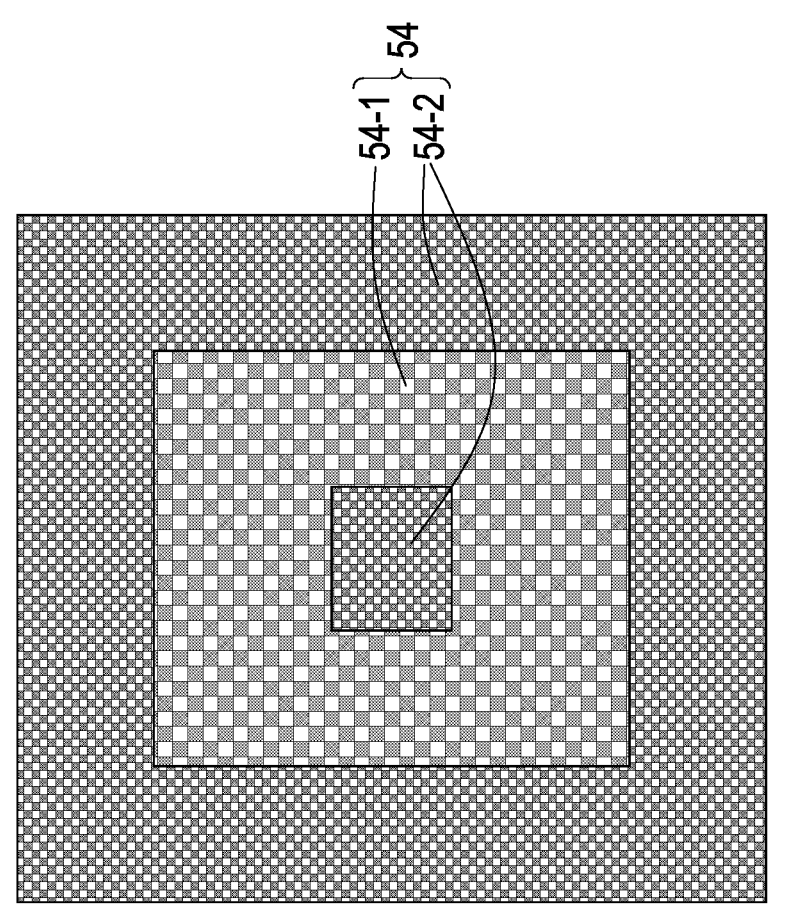

FIG. 7 illustrates that permeable plate 54 has different portions with different metal densities and different porosity densities. For example, FIG. 9 illustrates a bottom view of an example permeable plate 54 in FIG. 7, which permeable plate 54 includes portions 54-1 and 54-2. In accordance with some embodiments, portions 54-1 has a higher density of metal, and hence a lower density of porosity. In accordance with alternative embodiments, portions 54-1 has a lower density of metal, and hence a higher density of porosity. Also, FIG. 21B schematically illustrates portions 54-1 and 54-2 having different metal densities and different porosity densities in accordance with some embodiments.

FIG. 8 illustrates package 63 including metal lid 52 being assembled to package component 20. The liquid-metal-comprising media 60 as shown in FIG. 7 also migrates into permeable plate 54 to form composite TIM 62. In the portions (such as portions 62-1) of composite TIM 62 that have a higher density of metal and a lower density of porosity, the density of liquid-metal-comprising media 60 is lower. In the portions (such as portions 62-2) of composite TIM 62 that have a lower density of metal and a higher density of porosity, the density of liquid-metal-comprising media 60 is higher.

In accordance with some embodiments, the metal in permeable plate 54 has better thermal conductivity than the thermal conductivity of liquid-metal-comprising media 60. Accordingly, the portions 62-1 of composite TIM 62 may have a different (higher or lower) thermal conductivity than the portions 62-2 of composite TIM 62. Accordingly, the portions (such as portions 62-1) of composite TIM 62 with the higher thermal conductivity may be directly over and overlapping the portions of the package components generating more heat (and thus having higher temperatures), while the portions (such as portions 62-2) of composite TIM 62 with the lower thermal conductivity may be directly over and overlapping the portions of the package components generating less heat (and thus having lower temperatures).

Figure 10A:
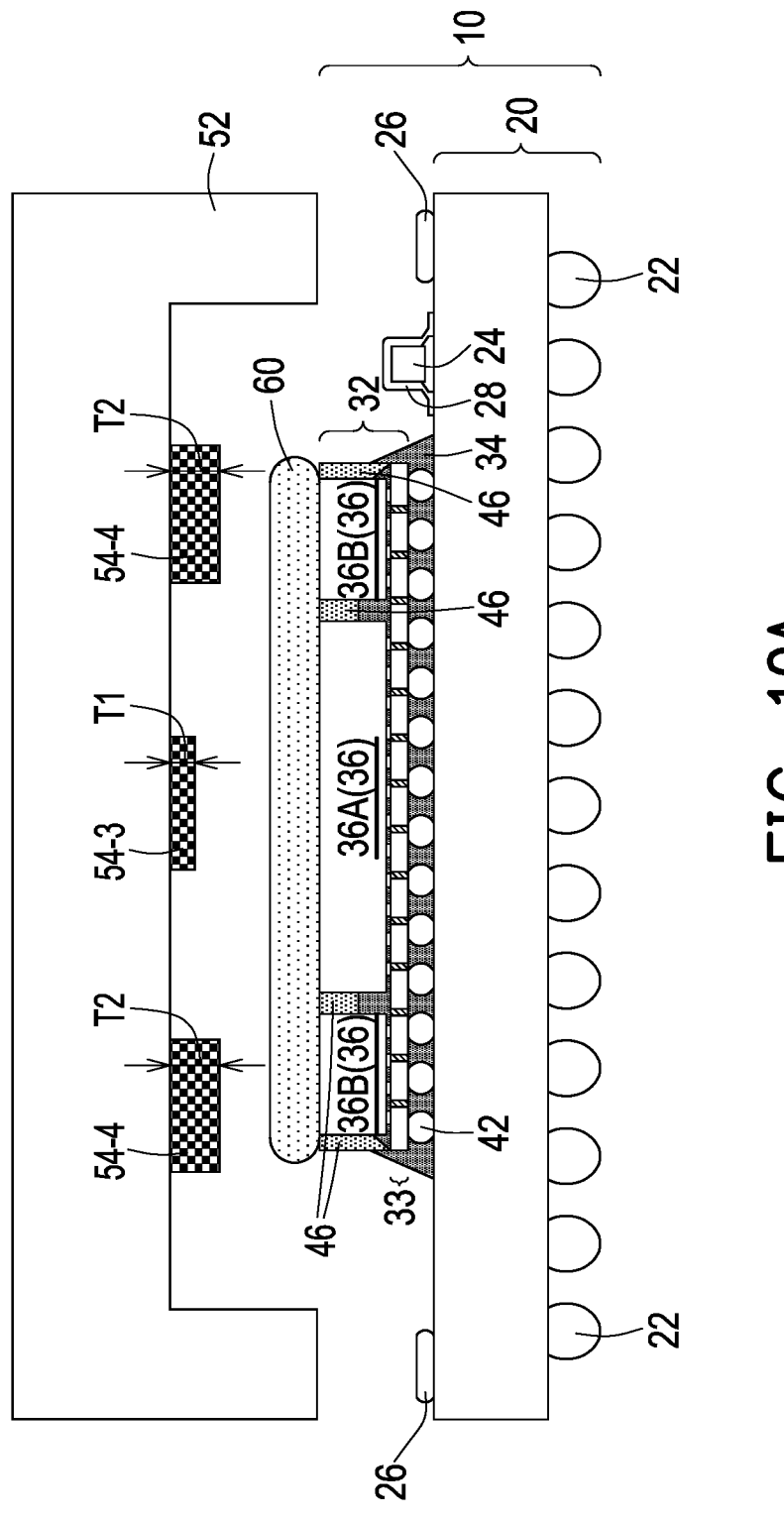
FIGS. 10A, 10B, and 11 illustrate the cross-sectional views and a top view of intermediate stages in the formation of a package including a permeable plate with a non-uniform thickness in accordance with some embodiments.
Figure 10B:
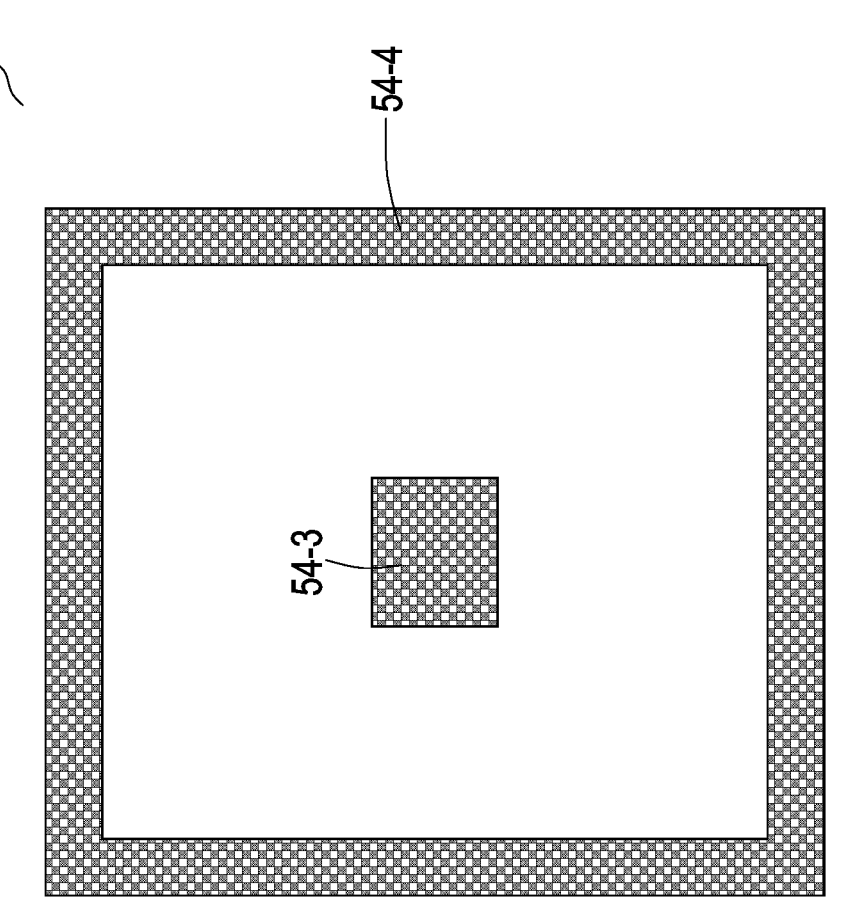
Figure 11:
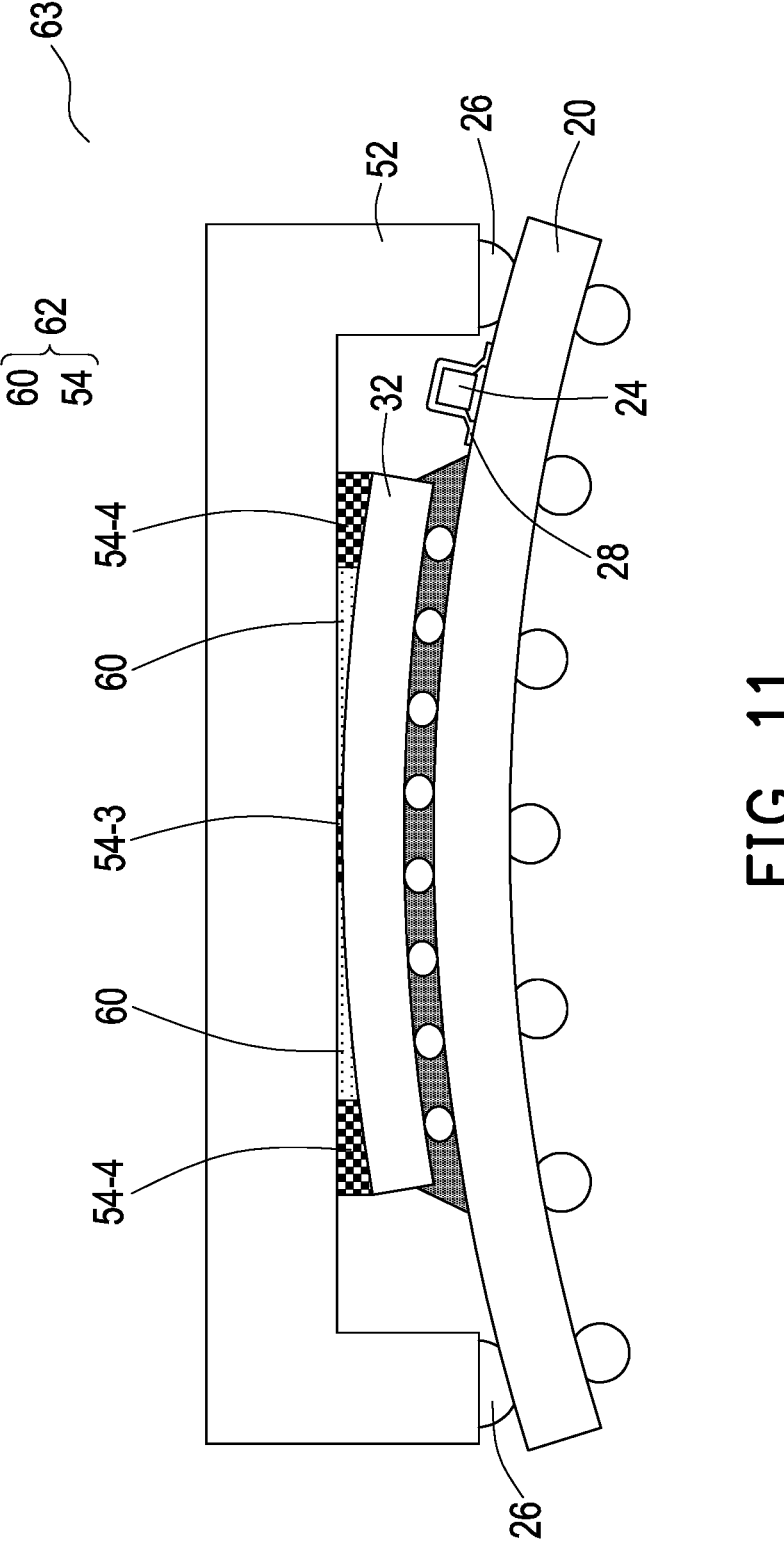

FIGS. 10A, 10B, and 11 illustrate the cross-sectional views and a top view of intermediate stages in the formation of package 63 in accordance with alternative embodiments of the present disclosure. In these embodiments, to suit to the warpage of the final package, permeable plate 54 has non-uniform thicknesses, so that the shape of the resulting composite TIM 62 may fit the top surface of package component 32. For example, as shown in FIG. 10A, the middle portion 54-3 of permeable plate 54 has thickness T1, and the edge portions 54-4 of permeable plate 54 has thickness T2 different from thickness T1. In the illustrated example, thickness T1 is smaller than thickness T2. In accordance with alternative embodiments, when package component 32 (FIG. 11) is bent with the middle portion being lower than edge portions, thickness T1 may also be designed to be greater than thickness T2. In accordance with some embodiments, thickness ratio T1/T2 is smaller than 0.8, and may be in the range between about 0.3 and about 0.8.

FIG. 10B illustrates a bottom view of the permeable plate 54 as shown in FIG. 10A. In the example embodiments as shown in FIG. 10B, middle portion 54-3 is separated from edge portions 54-4. In accordance with alternative embodiments, there may be bridging portions connecting middle portion 54-3 to edge portions 54-4.

FIG. 11 illustrates package 63 including metal lid 52 being assembled to package component 20. It is appreciated that the non-uniform thickness of composite TIM 62 fits the warped surface of package component 32 better than if the composite TIM 62 has a uniform thickness. The liquid-metal-comprising media 60 as shown in FIG. 10A flows into permeable plate 54 to form composite TIM 62 in FIG. 11. Furthermore, between middle portion 54-3 and edge portions 54-4, there is no portion of permeable plate 54 existing, and liquid-metal-comprising media 60 fills these regions. The edge portions 54-4 may act as a blocker to block liquid-metal-comprising media 60 from flowing out.

Figure 12:
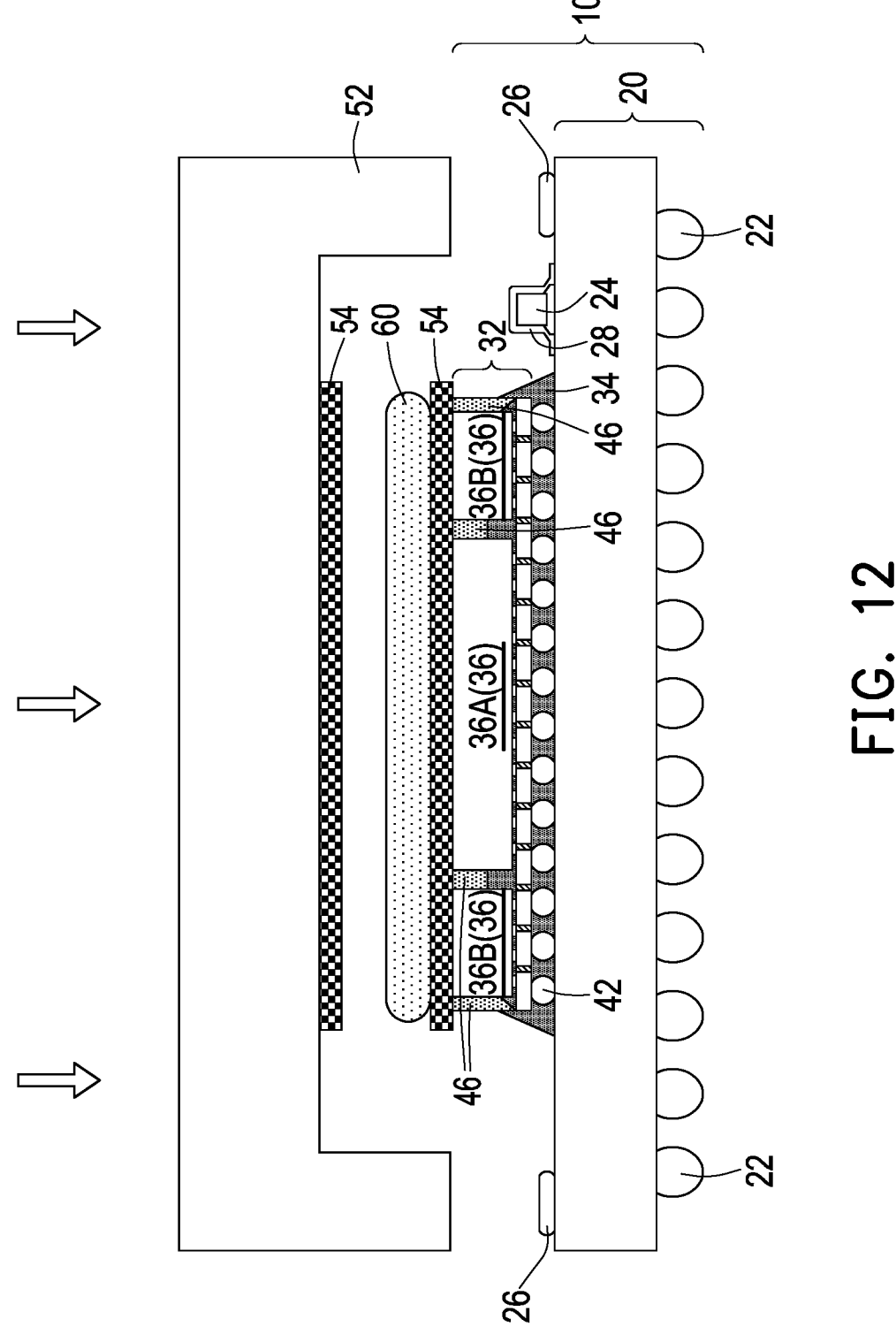
FIGS. 12 and 13 illustrate the cross-sectional views of intermediate stages in the formation of a package including two permeable plates in accordance with some embodiments.
Figure 13:
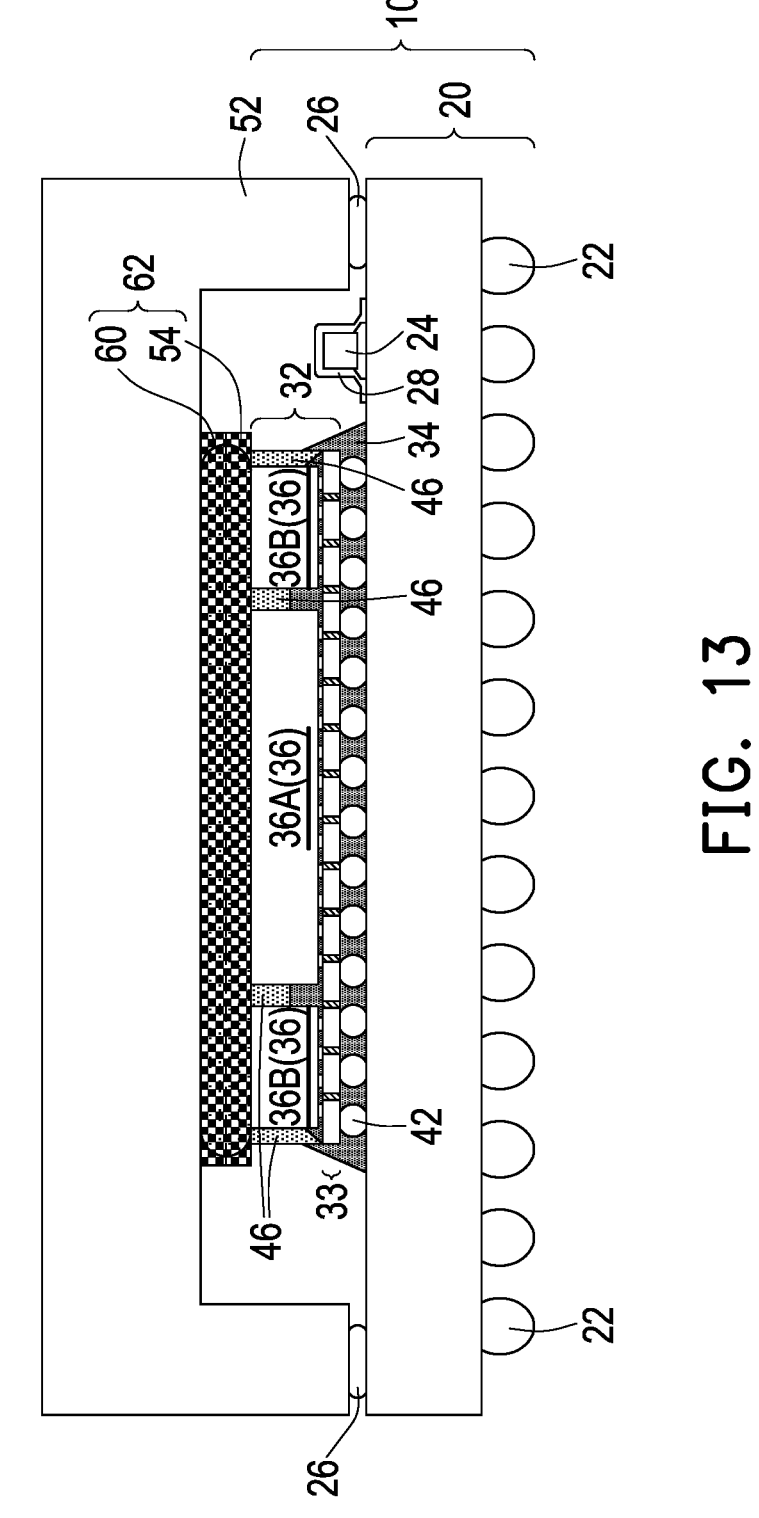

FIGS. 12 and 13 illustrate the cross-sectional views of intermediate stages in the formation of package 63 in accordance with alternative embodiments of the present disclosure. In these embodiments, as shown in FIG. 12, instead of having a single permeable plate 54, there are two permeable plates 54, with one attached to metal lid 52, and the other attached to package component 32. Liquid-metal-comprising media 60 may be dispensed to one of the two permeable plates 54.

FIG. 13 illustrates package 63 including metal lid 52 being assembled to package component 20. In the assembly process, liquid-metal-comprising media 60 flows into both of the permeable plates 54 to form the composite TIM 62, which includes two permeable plates 54 in contact with each other. The permeable plates 54 have an interface in between, and hence the two portions of TIM 62 are distinguishable from each other. The portions of liquid-metal-comprising media 60 in the two permeable plates 54, on the other hand, continuously extend into two permeable plates 54.

Figure 14A:
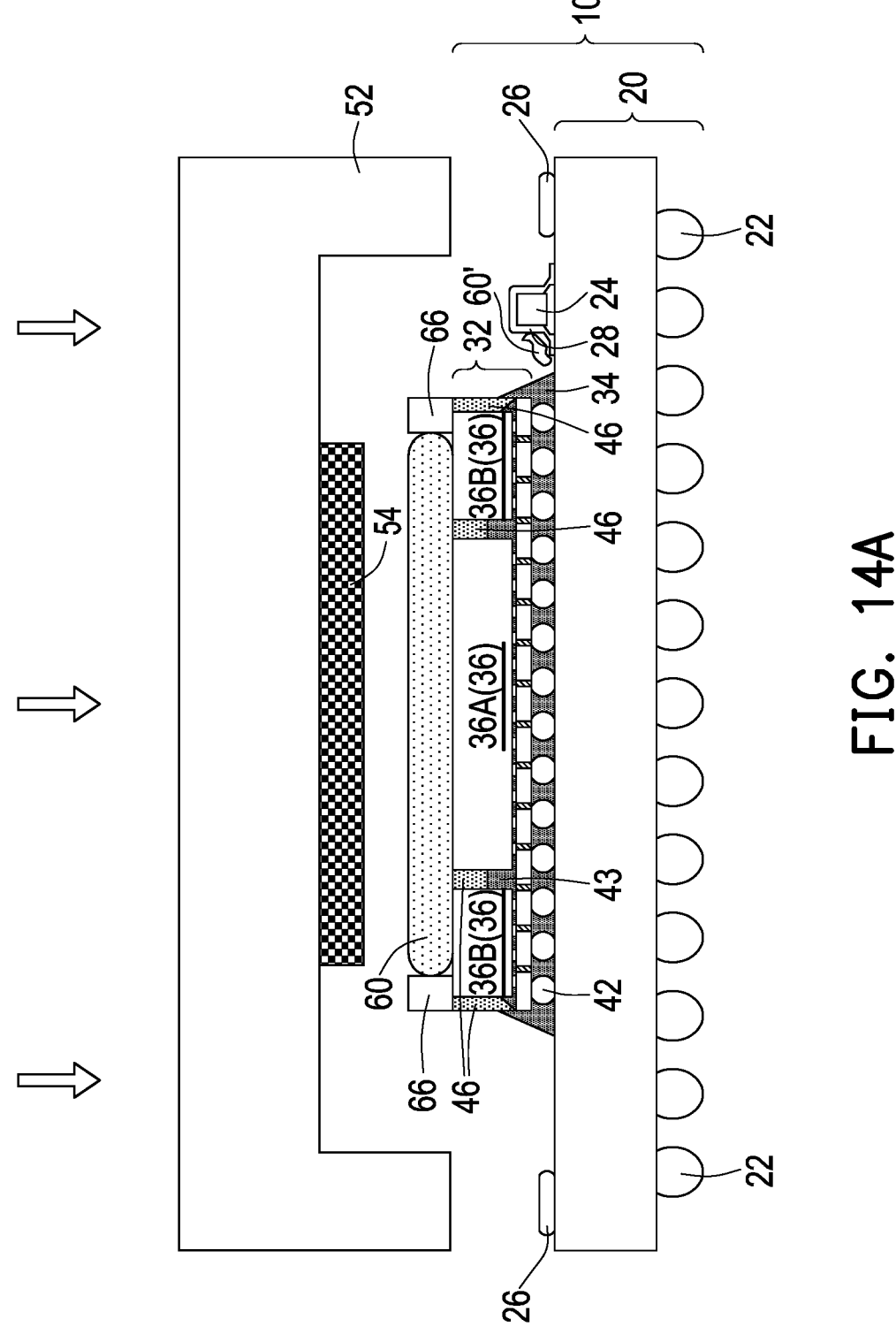
FIGS. 14A, 14B, and 15 illustrate the cross-sectional views and a top view of intermediate stages in the formation of a package including a blocker in accordance with some embodiments.
Figure 14B:
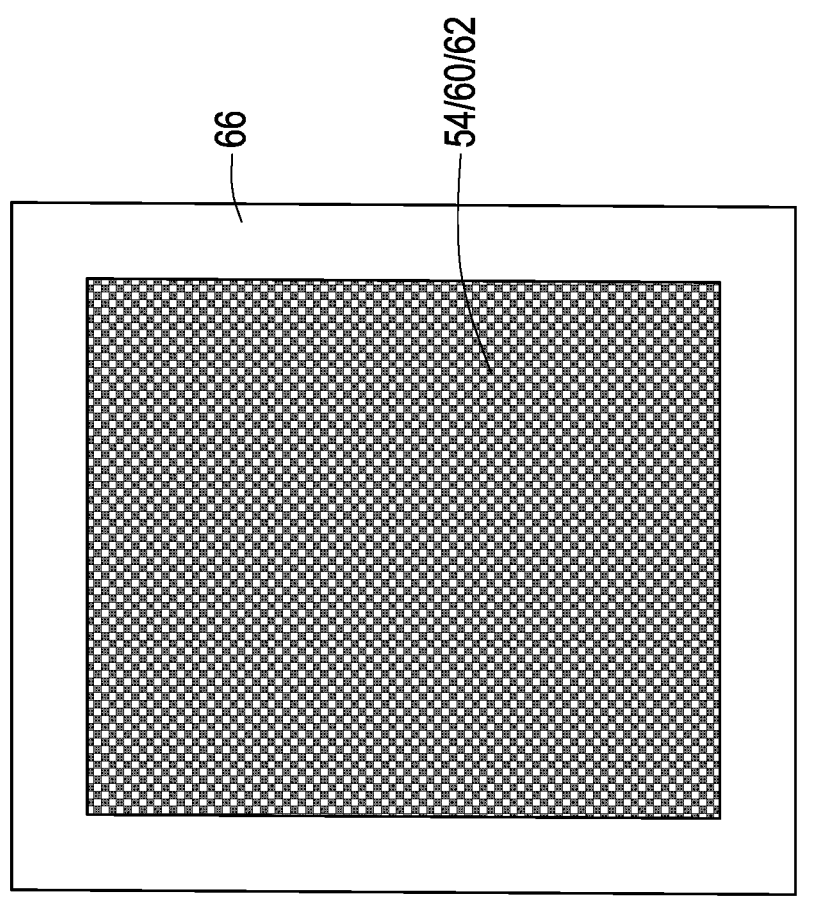
Figure 15:
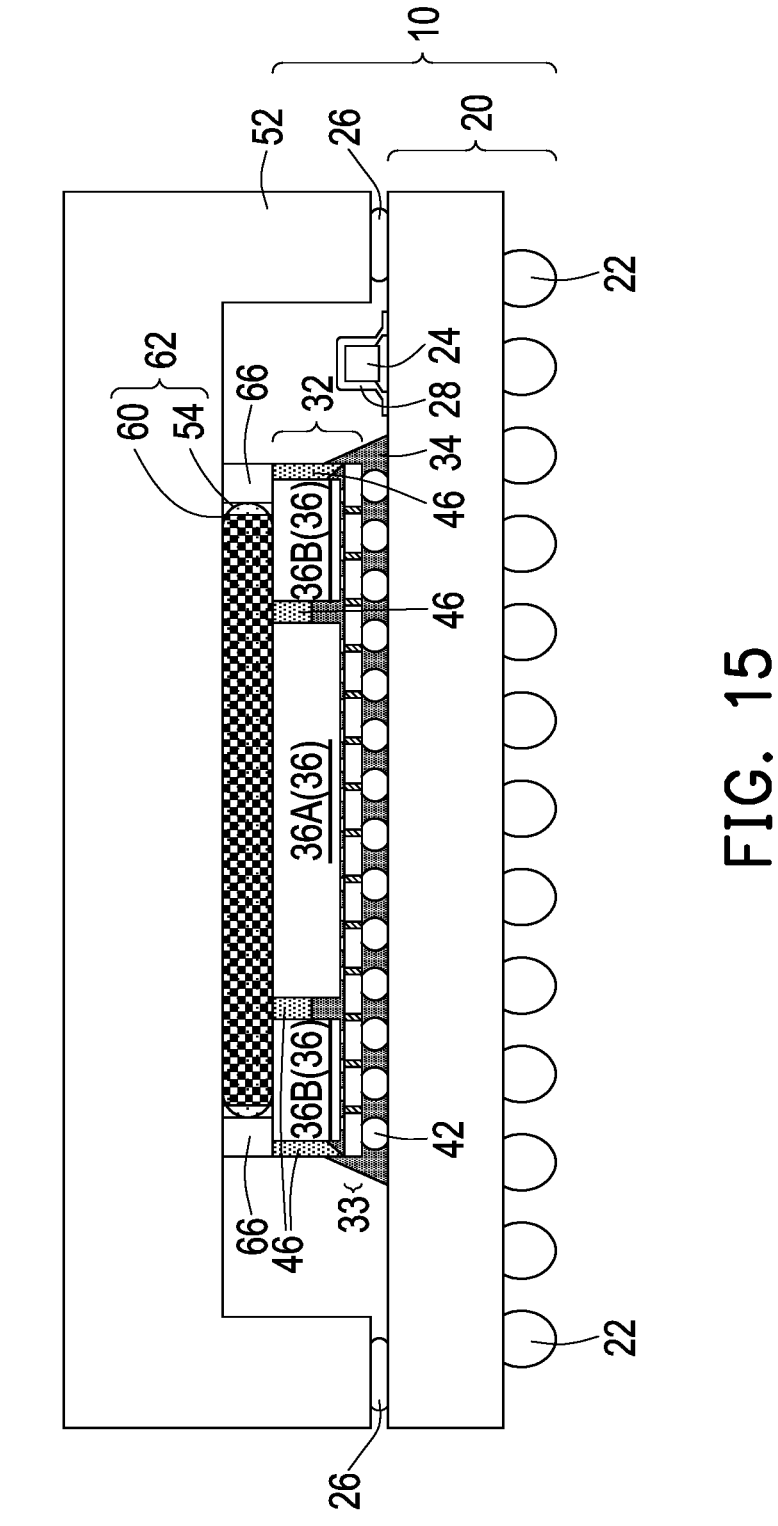

FIGS. 14A, 14B, and 15 illustrate the cross-sectional views and a top view of intermediate stages in the formation of a package in accordance with alternative embodiments of the present disclosure. In these embodiments, blocker 66 is placed in the peripheral region of the top surface of package component 32. Liquid-metal-comprising media 60 is placed/ dispensed inside blocker 66. In accordance with some embodiments, blocker 66 does not have through-channels therein, and does not allow liquid metal to migrate into it. Blocker 66 may be formed of or comprise a superhydrophobic material. The superhydrophobic material may be a silica-based material, which may be selected from submicron silica particle, silica powder, silicon oxide, titanium oxide, zinc oxide, silica nano-coating, a manganese oxide polystyrene ($MnO_2$/PS) nano-composite, a zinc oxide polystyrene (ZnO/PS) nano-composite, precipitated calcium carbonate, carbon nano-tube structures, fluorinated silanes and fluoropolymer coatings, and/or the like, and/or combinations thereof.

FIG. 14B illustrates a bottom view of blocker 66 and liquid-metal-comprising media 60. In the example embodiments as shown in FIG. 14B, blocker 66 forms a full ring, with a single large region encircled by blocker 66. In accordance with alternative embodiments, blocker 66 may include inner portions inside the outer full ring, with the inner portions separate the space encircled by the ring into two, three, four or more portions.

FIG. 15 illustrates package 63 including metal lid 52 being assembled to package component 20. It is appreciated that the liquid-metal-comprising media 60 is likely not hold well by permeable plate 54 in some circumstances, and blocker 66 will prevent the liquid-metal-comprising media 60 from flowing out.

Figure 16A:
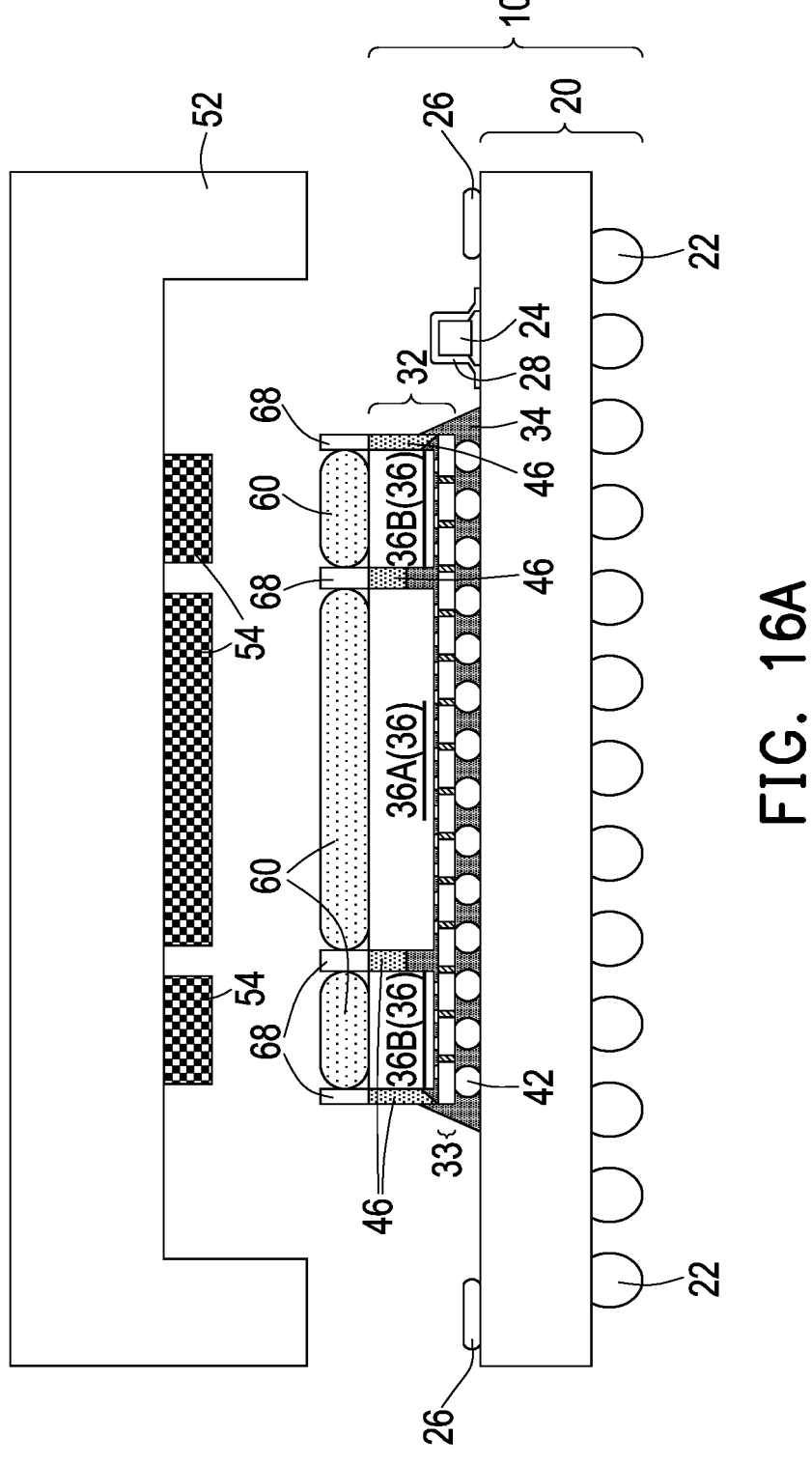
FIGS. 16A, 16B, and 17 illustrate the cross-sectional views and a top view of intermediate stages in the formation of a package including a hybrid thermal interface material in accordance with some embodiments.
Figure 16B:
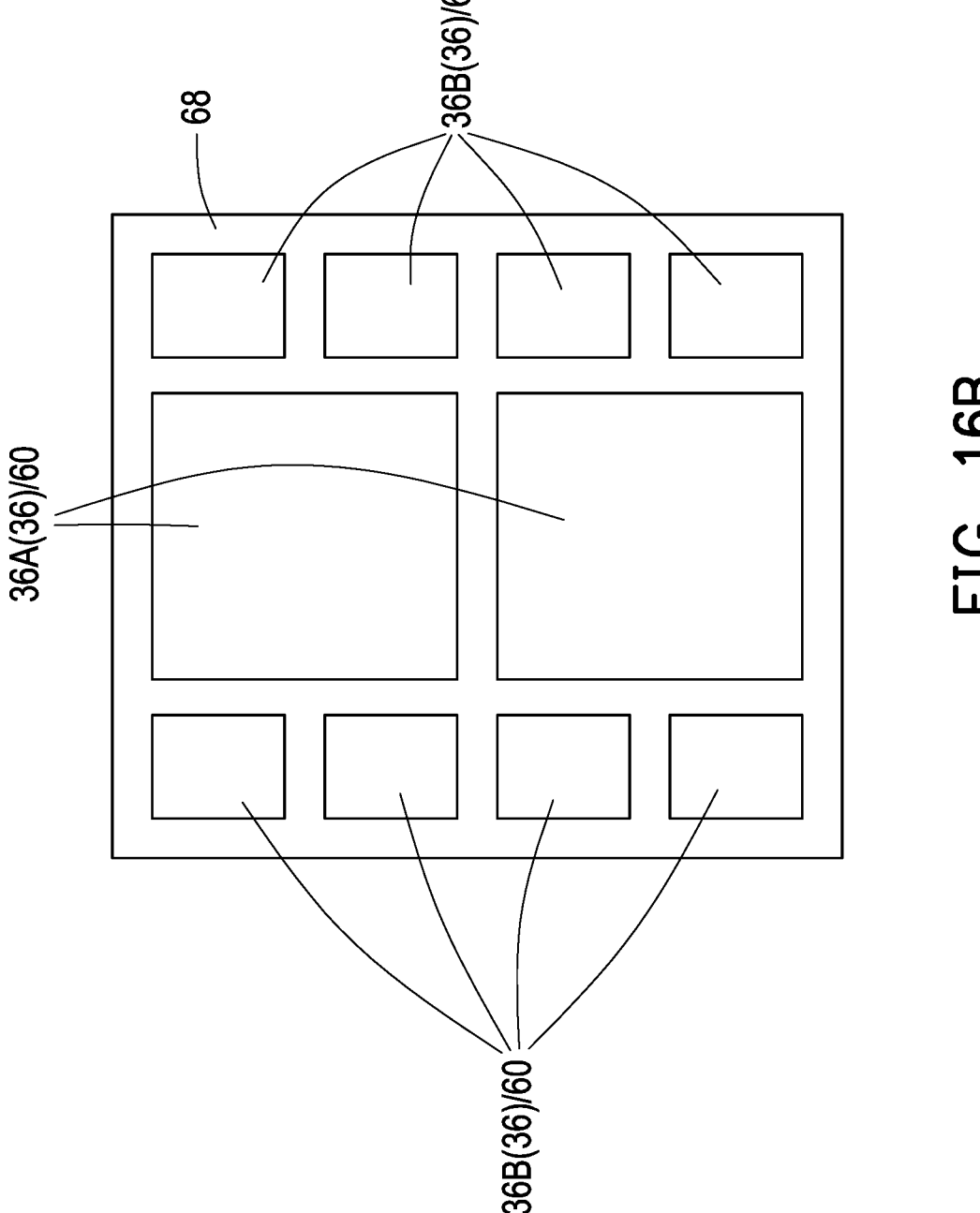
Figure 17:
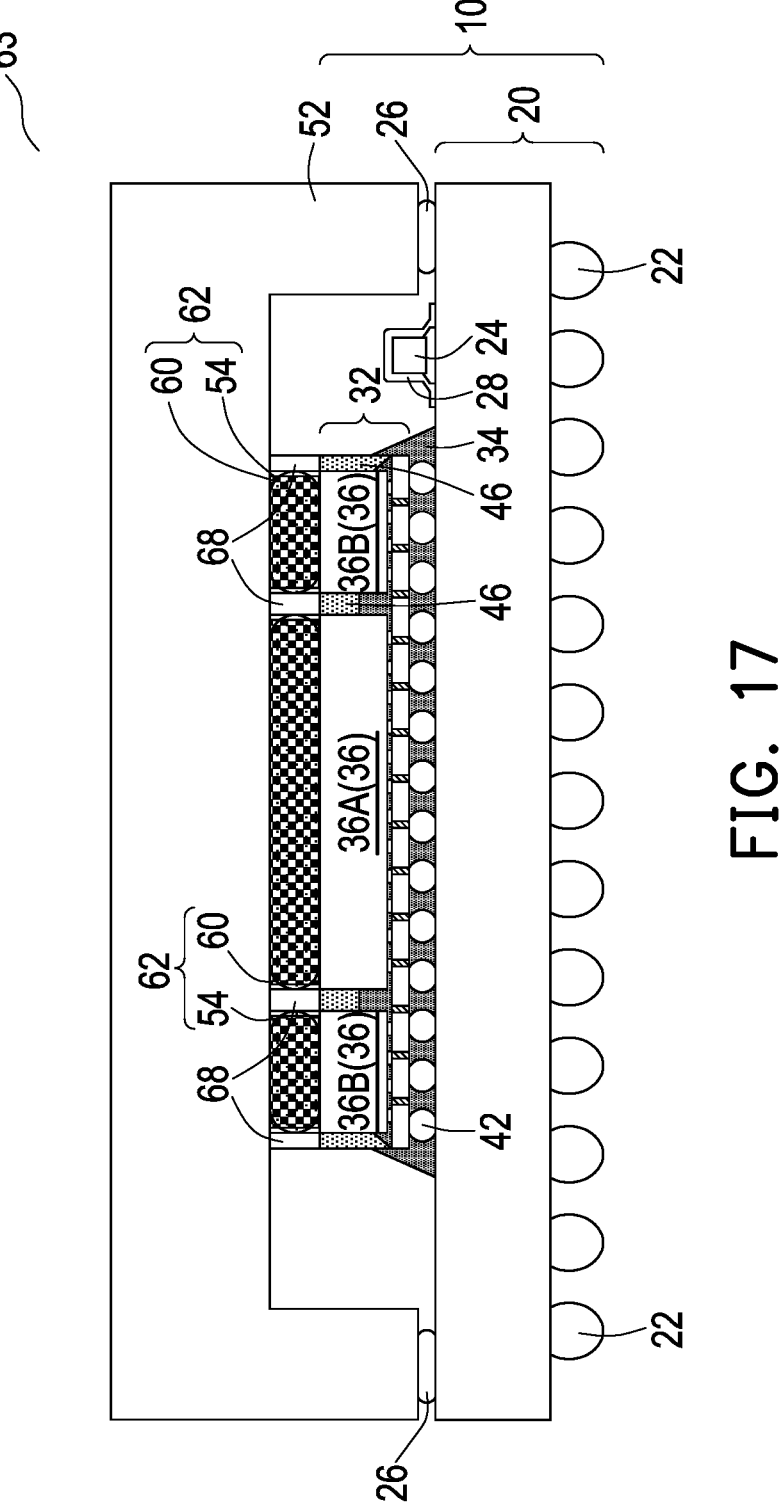

FIGS. 16A, 16B, and 17 illustrate the cross-sectional views and a top view of intermediate stages in the formation of package 63 in accordance with alternative embodiments of the present disclosure. In these embodiments, a hybrid TIM is formed, wherein the hybrid TIM includes the composite TIM 62 and a solid TIM 68, which may provide thermal conductivity and also helps to adhere metal lid 52 to package component 20. Referring to FIG. 16A, solid TIM 68 is adhered to package component 32, solid TIM 68 remains to be solid throughout the assembly process and also during the subsequent operation of the package, and does not include liquid metal therein. Liquid-metal-comprising media 60 may be dispensed between the portions of solid TIM 68.

In accordance with some embodiments, solid TIM 68 is placed over package component 32. In accordance with some embodiments, solid TIM 68 overlaps encapsulant 46, and does not overlap package components 36. In accordance with alternative embodiments, solid TIM 68 overlaps encapsulant 46, and may have some portions overlapping some portions of the package components 36 (such as memory dies) that generate less heat than other package components (such as system-on-chip dies). Solid TIM 68 may have a thermal conductivity in the range between about 5 W/m*K about 120 W/m*K.

FIG. 16B illustrates a bottom view of solid TIM 68 and liquid-metal-comprising media 60. In the example embodiments as shown in FIG. 16B, solid TIM 68 may encircle a plurality of portions of liquid-metal-comprising media 60, with each portion overlapping one of package components 36. Solid TIM 68 may also act as a blocker for blocking the liquid metal from flowing out.

FIG. 17 illustrates package 63 including metal lid 52 being assembled to package component 20. A plurality of composite TIMs 62 are formed, and are separated from each other by solid TIM 68. Solid TIM 68 and composite TIMs 62 are collectively referred to as a hybrid TIM.

Figure 18:
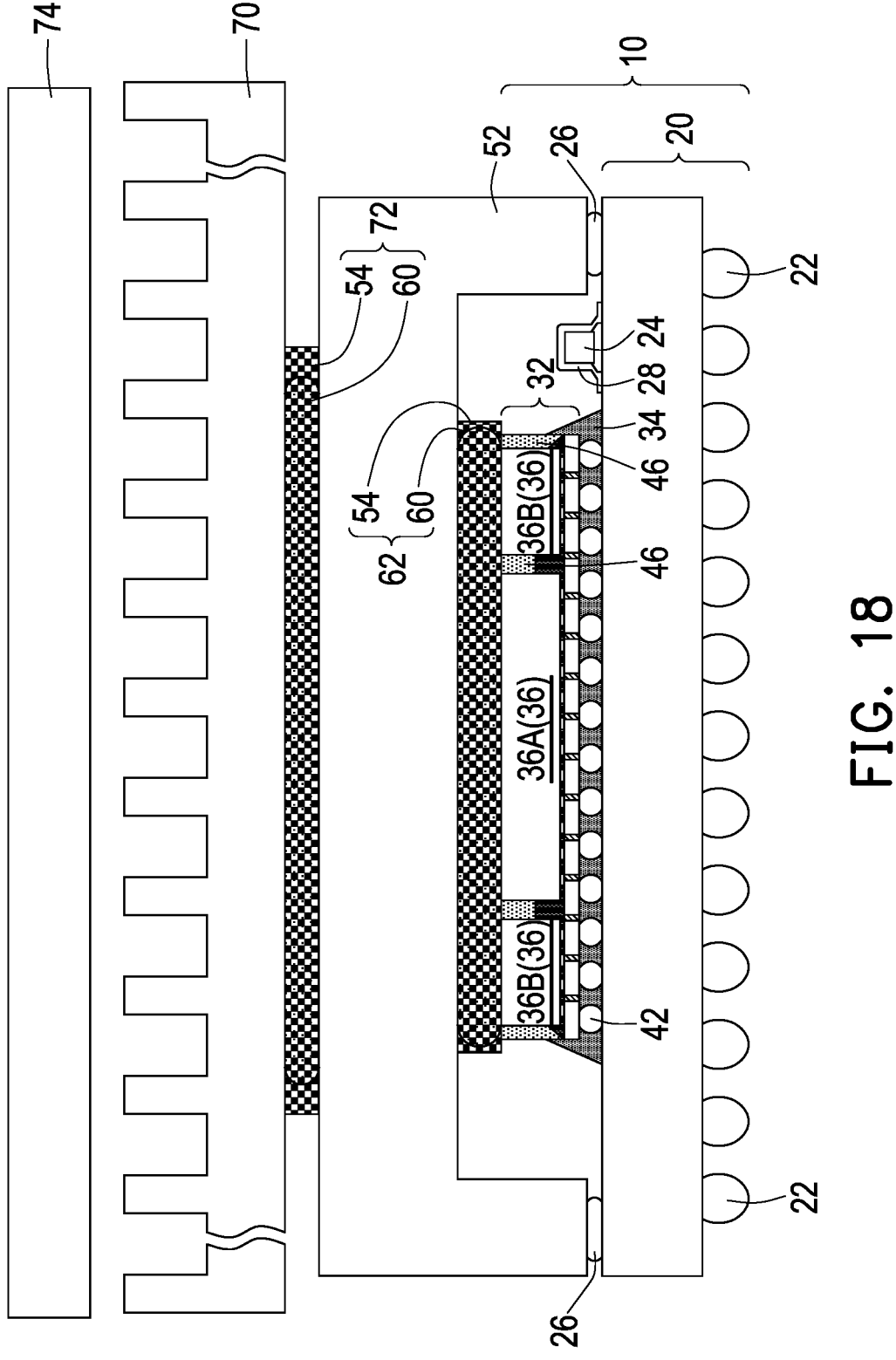
FIG. 18 illustrates the cross-sectional view of a package including a fan-cooling heat sink in accordance with some embodiments.
Figure 19:
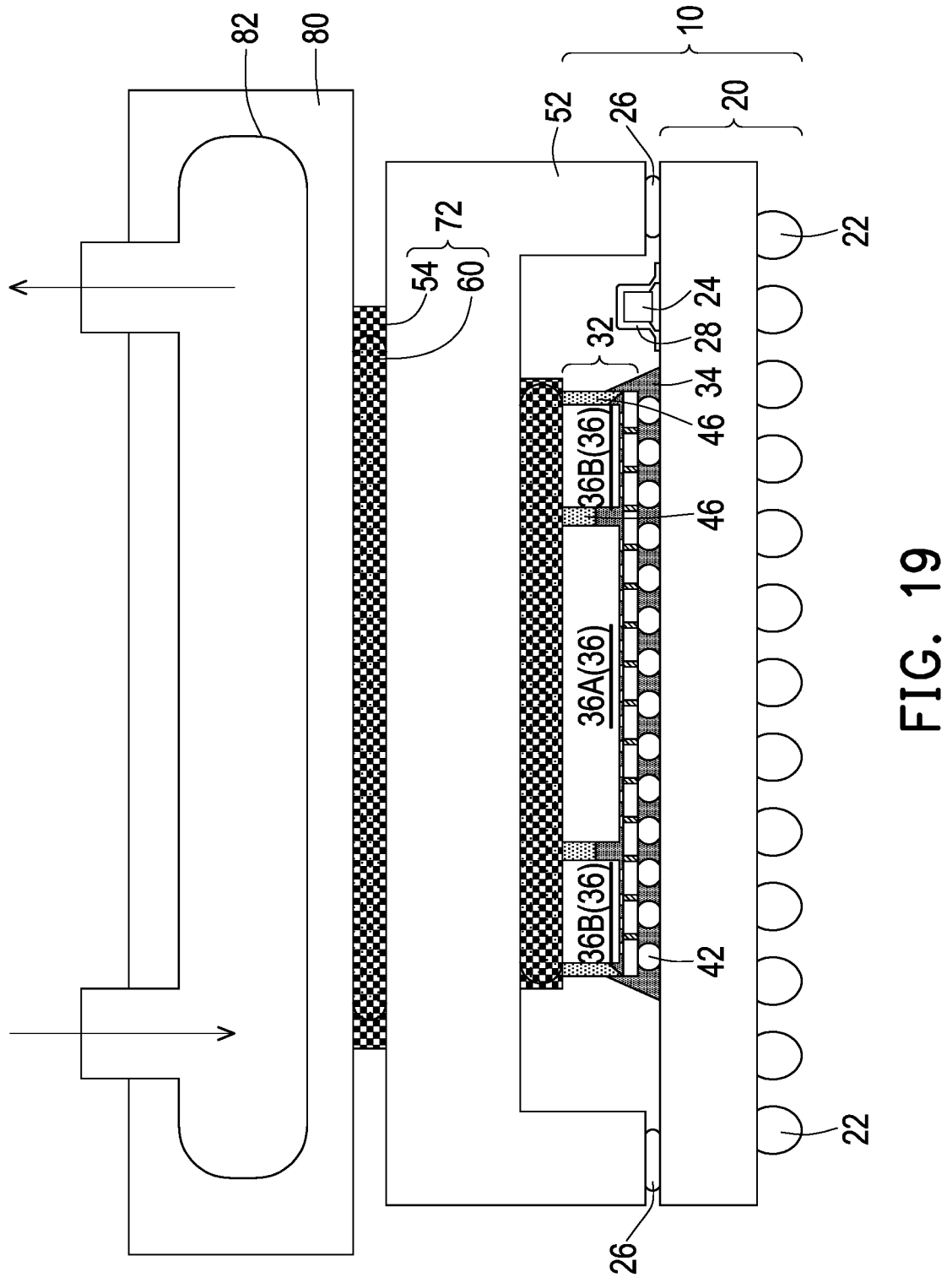
FIG. 19 illustrates the cross-sectional view of a package including a fan-cooling heat sink and a package including a liquid-cooling heat sink in accordance with some embodiments.
Figure 20:
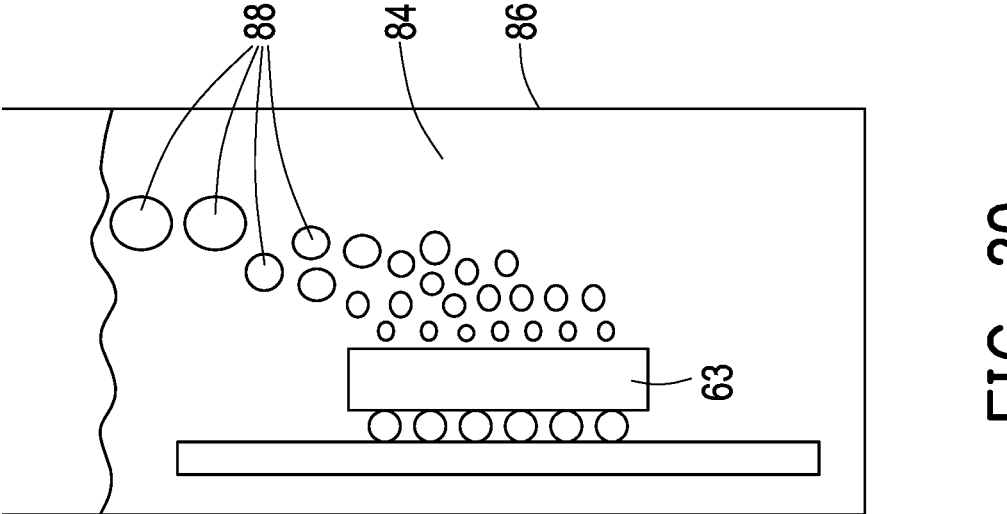
FIG. 20 illustrates the cross-sectional view of a package used in an immersion-cooling system in accordance with some embodiments.

FIGS. 18 through 20 illustrate the usage of some packages 63 in accordance with some embodiments. In FIG. 18, heat sink 70 is attached over metal lid 52 through TIM 72. In accordance with some embodiments, TIM 72 is a solid TIM that is free from liquid metal therein. In accordance with alternative embodiments, TIM 72 is also a composite TIM that includes liquid-metal-comprising media 60 and permeable plate 54 therein. Fan system 74 is placed over heat sink 70.

FIG. 19 illustrates a package similar to the package shown in FIG. 18, except that instead of using a heat sink and a fan system, a liquid cooling system is used. The liquid cooling system includes metal shell 80 having liquid channel 82 therein. A cooling media (oil, water, or the like) is conducted into and then out of the channel to provide the heat dissipation.

FIG. 20 illustrates an immersion cooling system, in which the package 63 is placed inside a cooling media 84, which is held in a tank 86. The cooling media 84 may comprise deionized water, oil, or the like, or may comprise some chemicals that are easy to vaporize. During the operation of the package, the heat generated in the package 63 turns the cooling media 84 into vapor, which rises to the surface of cooling media 84 in the form of bubbles 88.

It is appreciated that although the above-discussed figures may illustrate features separately in separate figures, these features may also be combined with the features shown in other figures in any combination whenever applicable. For example, although the blocker 66 is shown in FIGS. 14A, 14B, and 15 without being shown in other figures, blocker 66 may also be applied to any of the embodiments shown in FIGS. 5 through 13, 16A, 16B, and 17-20.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In a simulation performed on the package as shown in FIG. 18, it has been determined that when package components 36 have temperatures in the range between about 85° C. and about 105° C., the temperature of metal lid 52 may fall in the range between about 80° C. and about 95° C., which is high enough for liquid metal to melt. The temperature of heat sink 70 is in the range between about 5° C. and about 45° C. This indicates that the embodiments of the present disclosure have good heat-dissipation ability.

The embodiments of the present disclosure have some advantageous features. By using liquid metals to form composite TIMs, which are used for dissipating heat, the heat-dissipation efficiency is improved. The composite TIMs comprise permeable plates, so that liquid metal may be held inside the permeable plate, and may penetrate through permeable plate to reach the metal pad to provide more effective heat dissipation.

In accordance with some embodiments of the present disclosure, a method comprises attaching a permeable plate to a metal lid, wherein the permeable plate comprises a metallic material; dispensing a liquid-metal-comprising media to a first package component, wherein the first package component is over and bonded to a second package component, and wherein the liquid-metal-comprising media comprises a liquid metal therein; and attaching the metal lid to the second package component, wherein during the attaching, the liquid-metal-comprising media migrates into the permeable plate to form a composite thermal interface material. In an embodiment, at a time after the liquid-metal-comprising media is dispensed to the first package component and before the metal lid is attached to the second package component, the liquid-metal-comprising media is a solid plate.

In an embodiment, the liquid metal is molten during the attaching the metal lid to the second package component, and is molten by an elevated temperature, and wherein after the attaching, the liquid metal is returned to a solid state. In an embodiment, the liquid metal is configured to be molten by heat generated in the first package component when the first package component is powered up. In an embodiment, at a time after the liquid-metal-comprising media is dispensed to the first package component and before the metal lid is attached to the second package component, the liquid metal is at a liquid form. In an embodiment, the liquid-metal-comprising media further comprises solid particles mixed in the liquid metal. In an embodiment, the method further comprises dispensing a blocker on the first package component, wherein the liquid-metal-comprising media is encircled by the blocker.

In an embodiment, the method further comprises dispensing a solid thermal interface material on the first package component, wherein the first package component comprises a device die and a molding compound encircling the device die, and wherein the solid thermal interface material overlaps the molding compound, and the liquid-metal-comprising media is over and contacting the device die. In an embodiment, after the attaching, the liquid-metal-comprising media penetrates through the permeable plate to contact the metal lid. In an embodiment, the attaching the permeable plate to the metal lid comprises attaching a metal mesh to the metal lid, wherein the metal mesh comprises woven metal wires.

In accordance with some embodiments of the present disclosure, a structure comprises a first package component; a second package component over and bonded to the first package component; an adhesive over and attached to the first package component; a metal lid attached to the first package component through the adhesive; and a composite thermal interface material between, and in physical contact with both of, the second package component and the metal lid, wherein the composite thermal interface material comprises a permeable plate; and a liquid-metal-comprising media in the permeable plate, wherein the liquid-metal-comprising media comprises a liquid metal. In an embodiment, the liquid metal is a liquid at room temperature. In an embodiment, the liquid metal is a solid at room temperature, and wherein the liquid metal has a phase-change temperature in a range between about 60° C. and about 85° C., with the liquid metal configured to change phase to liquid at the phase-change temperature.

In an embodiment, the liquid-metal-comprising media fills first parts of through-channels of the permeable plate, and wherein second parts of through-channels in the permeable plate are air gaps. In an embodiment, the composite thermal interface material comprises a first middle portion overlapping a second middle portion of the second package component, wherein the first middle portion has a first thickness; and a first edge portion overlapping a second edge portion of the second package component, wherein the first edge portion has a second thickness different from the first thickness. In an embodiment, the structure further comprises a solid thermal interface material between, and in physical contact with both of, the second package component and the metal lid. In an embodiment, the structure further comprises a blocker encircling the composite thermal interface material, wherein the blocker is hydrophobic.

In accordance with some embodiments of the present disclosure, a structure comprises a device die; a molding compound encircling the device die; and a composite thermal interface material over and contacting the molding compound and the device die, wherein the composite thermal interface material comprises a metal mesh; and a liquid-metal-comprising media extending to opposing sides of the metal mesh, wherein the liquid-metal-comprising media comprises a liquid metal, and wherein the liquid metal comprises a material selected from the group consisting of a gallium-based alloy, a bismuth-base alloy, and combinations thereof. In an embodiment, the liquid metal is a liquid at room temperature. In an embodiment, the liquid metal is a solid at room temperature, and the liquid metal is configured to change phase to a liquid when the device die is provided with power.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
attaching a permeable plate to a metal lid, wherein the permeable plate comprises a metallic material;
dispensing a liquid-metal-comprising media to a first package component, wherein the first package component is over and bonded to a second package component, and wherein the liquid-metal-comprising media comprises a liquid metal therein; and
attaching the metal lid to the second package component, wherein during the attaching, the liquid-metal-comprising media migrates into the permeable plate to form a composite thermal interface material.

2. The method of claim 1, wherein at a time after the liquid-metal-comprising media is dispensed to the first package component and before the metal lid is attached to the second package component, the liquid-metal-comprising media is a solid plate.

3. The method of claim 2, wherein the liquid metal is molten during the attaching the metal lid to the second package component, and is molten by an elevated temperature, and wherein after the attaching, the liquid metal is returned to a solid state.

4. The method of claim 3, wherein the liquid metal is configured to be molten by heat generated in the first package component when the first package component is powered up.

5. The method of claim 1, wherein at a time after the liquid-metal-comprising media is dispensed to the first package component and before the metal lid is attached to the second package component, the liquid metal is in a liquid form.

6. The method of claim 5, wherein the liquid-metal-comprising media further comprises solid particles mixed in the liquid metal.

7. The method of claim 1 further comprising dispensing a blocker on the first package component, wherein the liquid-metal-comprising media is encircled by the blocker.

8. The method of claim 1 further comprising dispensing a solid thermal interface material on the first package component, wherein the first package component comprises a device die and a molding compound encircling the device die, and wherein the solid thermal interface material overlaps the molding compound, and the liquid-metal-comprising media is over and contacting the device die.

9. The method of claim 1, wherein after the attaching, the liquid-metal-comprising media penetrates through the permeable plate to contact the metal lid.

10. The method of claim 1, wherein the attaching the permeable plate to the metal lid comprises attaching a metal mesh to the metal lid, wherein the metal mesh comprises woven metal wires.

11. A method comprising:

placing a first package component;

attaching a second package component over the first package component;

attaching an adhesive over the first package component;

attaching a metal lid to the first package component through the adhesive, wherein a composite thermal interface material is formed between, and in physical contact with both of, the second package component and the metal lid, and wherein the composite thermal interface material comprises:

a permeable plate; and a liquid-metal-comprising media in the permeable plate, wherein the liquid-metal-comprising media comprises a liquid metal, and the liquid-metal-comprising media is a solid at room temperature, and wherein the attaching the metal lid comprises heating the liquid-metal-comprising media as a liquid during the attaching the metal lid to the first package component.

12. The method of claim 11, wherein the liquid-metal-comprising media is a paste at room temperature, and the method further comprises heating the liquid-metal-comprising media as a liquid during the attaching the metal lid to the first package component.

13. The method of claim 11, wherein:

at a first time before the attaching the metal lid to the first package component, the liquid-metal-comprising media and the permeable plate are discrete components; and at a second time after the attaching the metal lid to the first package component, the liquid-metal-comprising media fills first parts of through-channels of the permeable plate, and wherein second parts of the through-channels in the permeable plate are air gaps.

14. The method of claim 11, wherein the composite thermal interface material comprises:

a first middle portion overlapping a second middle portion of the second package component, wherein the first middle portion has a first thickness; and a first edge portion overlapping a second edge portion of the second package component, wherein the first edge portion has a second thickness different from the first thickness.

15. The method of claim 11 further comprising attaching a solid thermal interface material between, and in physical contact with both of, the second package component and the metal lid.

16. The method of claim 11 further comprising placing a blocker over the first package component, wherein the composite thermal interface material is encircled by the blocker.

17. The method of claim 11, wherein the permeable plate comprises a plurality of layers of wires.

18. A method comprising:

encapsulating a device die in a molding compound;

dispensing a liquid-metal-comprising media as a paste over the molding compound and the device die;

after the liquid-metal-comprising media is dispensed, forming a composite thermal interface material over and contacting the molding compound and the device die, wherein the composite thermal interface material comprises:

a metal mesh; and the liquid-metal-comprising media extending to opposing sides of the metal mesh, wherein the liquid-metal-comprising media comprises a liquid metal, and wherein the liquid metal comprises a material selected from the group consisting of a gallium-based alloy, a bismuth-base alloy, and combinations thereof.

19. The method of claim 18, wherein the liquid-metal-comprising media is a solid at room temperature, and the liquid-metal-comprising media is configured to change phase to a liquid when the device die is provided with power.

20. The method of claim 18, wherein the metal mesh comprises a plurality of layers of wires.

* * * * *